United States Patent [19]
Yamasaki et al.

[11] Patent Number: 6,065,143
[45] Date of Patent: May 16, 2000

[54] SEMICONDUCTOR MEMORY DEVICE CAPABLE OF FAST TESTING WITHOUT EXTERNALLY CONSIDERING ADDRESS SCRAMBLE OR DATA SCRAMBLE

[75] Inventors: Kyoji Yamasaki; Yutaka Ikeda, both of Hyogo, Japan

[73] Assignee: Mitsubishi Denki Kabushiki Kaisha, Tokyo, Japan

[21] Appl. No.: 08/905,542

[22] Filed: Aug. 4, 1997

[30] Foreign Application Priority Data

Dec. 5, 1996 [JP] Japan ................................. 8-325340

[51] Int. Cl.[7] .............................. G11C 29/00; G11C 7/00
[52] U.S. Cl. ......................... 714/720; 365/201; 365/226
[58] Field of Search .................................. 714/718, 719, 714/720, 738, 743, 42; 711/100; 365/200, 201, 226

[56] References Cited

U.S. PATENT DOCUMENTS

| | | | |
|---|---|---|---|
| 5,034,923 | 7/1991 | Kuo et al. | 365/189.01 |
| 5,463,585 | 10/1995 | Sanada | 365/201 |
| 5,483,488 | 1/1996 | Sanada | 365/189.03 |
| 5,742,615 | 4/1998 | Konodo et al. | 371/21.3 |
| 5,764,576 | 6/1998 | Hidaka et al. | 365/200 |

FOREIGN PATENT DOCUMENTS

| | | |
|---|---|---|
| 60-15900 | 1/1985 | Japan . |
| 62-38600 | 2/1987 | Japan . |
| 7-282599 | 10/1995 | Japan . |

*Primary Examiner*—Christine Tu
*Attorney, Agent, or Firm*—McDermott, Will & Emery

[57] ABSTRACT

A row address signal output from an internal row address generation circuit according to an output from a ring oscillator activated in response to an externally applied burn-in mode designation signal SBT, is scrambled by an operation circuit and then applied to a row decoder. Meanwhile, a signal output from a data output circuit in response to activation of signal SBT is scrambled by a data scrambler and checker pattern data is applied to a memory cell array such that it corresponds to a physical address of the memory cell array.

15 Claims, 24 Drawing Sheets

| | <A2R, A1R, A0R> | | | /φ → | <RA2, RA1, RA0> | | | |
|---|---|---|---|---|---|---|---|---|
| 0 | 0 | 0 | 0 | | 0 | 0 | 0 | 0 |
| 1 | 0 | 0 | 1 | | 0 | 0 | 1 | 1 |
| 2 | 0 | 1 | 0 | | 0 | 1 | 1 | 3 |
| 3 | 0 | 1 | 1 | | 0 | 1 | 0 | 2 |
| 4 | 1 | 0 | 0 | | 1 | 1 | 1 | 7 |
| 5 | 1 | 0 | 1 | | 1 | 1 | 0 | 6 |
| 6 | 1 | 1 | 0 | | 1 | 0 | 0 | 4 |
| 7 | 1 | 1 | 1 | | 1 | 0 | 1 | 5 |

| | <RA2, RA1, RA0> | | | $\phi$ | <A2R, A1R, A0R> | | | |
|---|---|---|---|---|---|---|---|---|
| 0 | 0 | 0 | 0 | | 0 | 0 | 0 | 0 |
| 1 | 0 | 0 | 1 | | 0 | 0 | 1 | 1 |
| 2 | 0 | 1 | 0 | | 0 | 1 | 1 | 3 |
| 3 | 0 | 1 | 1 | | 0 | 1 | 0 | 2 |
| 4 | 1 | 0 | 0 | | 1 | 1 | 0 | 6 |
| 5 | 1 | 0 | 1 | | 1 | 1 | 1 | 7 |
| 6 | 1 | 1 | 0 | | 1 | 0 | 1 | 5 |
| 7 | 1 | 1 | 1 | | 1 | 0 | 0 | 4 |

| AOR | Din | → Dcell |
|---|---|---|
| 0 | L | L |
| 0 | H | H |
| 1 | L | H |
| 1 | H | L |

| A0R | Dcell | → Din |
|-----|-------|-------|
| 0 | L | L |
| 0 | H | H |
| 1 | L | H |
| 1 | H | L |

FIG.14

| WL | Dcell $\xrightarrow{\eta}$ | Din $\xrightarrow{/\eta}$ | |
|---|---|---|---|
| 0 | L | L | L |
| 1 | H | L | H |
| 2 | L | L | L |
| 3 | H | L | H |
| 4 | L | L | L |
| ⋮ | ⋮ | ⋮ | ⋮ |

FIG.15

| WL | Dcell $\xrightarrow{\eta}$ | Din $\xrightarrow{/\eta}$ | |
|---|---|---|---|
| 0 | H | H | H |
| 1 | L | H | L |
| 2 | H | H | H |
| 3 | L | H | L |
| 4 | H | H | H |
| ⋮ | ⋮ | ⋮ | ⋮ |

FIG.32

| | →Y | | | | |
|---|---|---|---|---|---|
| ↓X | H (1) | L (2049) | H (4097) | • • • | L |
| | L (2) | H (2050) | L (4098) | • • • | H |
| | H (3) | L (2051) | H (4099) | | L |
| | •<br>•<br>• | •<br>•<br>• | •<br>•<br>• | | •<br>•<br>• |
| | L (2048) | H (4096) | L (6144) | • • • | H |

SEMICONDUCTOR MEMORY DEVICE CAPABLE OF FAST TESTING WITHOUT EXTERNALLY CONSIDERING ADDRESS SCRAMBLE OR DATA SCRAMBLE

BACKGROUND OF THE INVENTION

1. Field of the Invention

The present invention relates to a semiconductor memory device and, in particular, to a configuration of a semiconductor memory device for testing the semiconductor memory device at high speed.

2. Description of the Background Art

As the memory capacity of semiconductor memory devices and, in particular, of dynamic RAMs (referred to as DRAMs hereinafter) is greatly increased, the time required for semiconductor memory device testing is also greatly increased.

As the memory capacity of a semiconductor memory device is increased, the number of word lines included therein is also increased. Thus, the time required for performing operations of writing and reading information into and from memory cells while sequentially selecting word lines is significantly increased and thus the problem of the time increased for semiconductor memory device testing is caused.

The problem described above is severe in process testing such as burn-in testing. In the burn-in testing, a semiconductor memory device is operated at high temperature and high voltage so that latent initial defections such as defections of a gate insulating film, an interlayer insulating film between interconnections and of interconnections of an MOS transistor as a component, defections resulting from particles mixed during the manufacturing process and the like may be revealed to remove defective products before shipping.

Such a burn-in testing is a testing essential to maintaining the quality of products to be shipped and thus increase in the time required for the testing is directly linked to increase in cost for manufacturing semiconductor memory devices.

The problem of the increased testing time is also caused in reliability testing such as lifetime testing.

In a burn-in testing such as described above, a predetermined information to be stored is prewritten into each memory cell which is sequentially read by sequentially selecting a word line and the read information is compared with an expected value, which is the written information, to detect any data bit error and thus find any defection of a product. Thus, such a burn-in testing is typically conducted on each semiconductor memory device after chip separation and assembling so that a predetermined information to be stored is externally written into a memory cell at a predetermined address. More specifically, a burn-in testing such as described above is conducted, for example, on a semiconductor memory device which has been sealed into a mold package and assembled into a shape similar to the final product.

For DRAM or the like, a physical address corresponding to the actual arrangement of a memory cell on a semiconductor memory device can not always match an externally applied address value depending on the arrangement memory cells, word lines and pairs of bit lines.

Writing of data into a semiconductor memory device which requires address scrambling, in particular, writing of data in a checker pattern is elucidated.

FIG. 28 is a schematic block diagram showing a configuration of a circuitry for writing data in a conventional DRAM 2000.

The conventional DRAM 2000 includes a memory cell array 100 having memory cells arranged in a matrix, a row decoder 102 which selects a corresponding word line (a corresponding row) in response to a row address signal externally applied, a column decoder 104 which selects a corresponding pair of bit lines (a column) in response to a column address signal externally applied, a control circuit 118 which receives a row address strobe signal RAS and a column address strobe signal /CAS both externally applied to output an internal control signal, a write control circuit 136 which is controlled by control circuit 118 and also receives an externally applied write enable signal /WE to control writing operation, a data input buffer 162 which receives, buffers and outputs external write data ext.DQ0–ext.DQn input to an external data input/output terminal 160, and a write driver circuit 164 which is controlled by write control circuit 136 and also receives an output from data input buffer 162 to drive the potential level of an selected pair of bit lines to a potential level depending on the write data.

Signal /WE input to external control signal input terminal 154 is a write enable signal which designates data writing. Signal /RAS input to external control signal input terminal 152 is a row address strobe signal which initiates an internal operation of a semiconductor memory device and also determines an active time period of the internal operation.

When signal /RAS is activated, the circuit which is related to the operation for selecting a row of memory cell array 100, such as row decoder 102, is activated. Signal /CAS input to external control signal input terminal 150 is a column address strobe signal and activates the circuit for selecting a column in memory cell array 100.

FIG. 29 is a conceptual view showing a correspondence between a row address externally applied and an internal row address signal in a memory cell.

In the example shown in FIG. 29, address scrambling is performed for recombination for A0R and A1R of a row address signal externally applied.

An exclusive OR circuit 142 receives the second least significant bit signal A1R and the third least significant bit signal A2R of an externally applied row address signal and outputs the second least significant bit signal RA1 of an internal row address signal.

An external OR circuit 140 receives the least significant bit A0R of the externally applied row address signal and also exclusively receives an output of exclusive OR circuit 142 to output the least significant bit signal RA0 of the internal row address signal.

Generally, depending on the arrangement of word lines, bit lines and the like, an externally applied address and a physical address of a memory cell selected on memory cell array 100 has a correspondence equivalent to execution of some logical processing.

Such a recombination between an externally applied address signal and an address signal selected in internally writing data causes a problem such as described below.

Prior to describing the problem, a structure of a memory cell portion in a typical DRAM will be briefly described.

FIG. 30 is a cross sectional view of the structure of the memory cell portion of the typical DRAM. Referring to FIG. 30, a DRAM memory cell 614 includes a memory cell transistor formed of an n type heavily doped layer 606 to which bit line 611 is connected, a word line 605 and of an n type heavily doped layer 606 to which a storage node 609 is connected, and a memory cell capacitor formed of storage node 609 for storing electric charge therein, a dielectric film 615 and of a cell plate 610 which is an opposing electrode of the capacitor. Each element is separated by a separating oxide film 604, and formed closer to the substrate are a p type well 603 and an n type well 602 on substrate 1. P type well 603 receives potential supply from an interconnection 613 via the p type high concentration layer to fix its potential.

FIG. 31 is an equivalent circuit diagram of the memory cell portion shown in FIG. 30. Referring to FIG. 31, storage node 609 as an accumulated charge capacitor electrode of the memory cell is connected to p well 603 by a diode configuration.

Now it is assumed that there is leak current between the memory cell capacitors of adjacent memory cells or that there is a latent defection which will cause such leakage.

In order to detect whether there is such defective leakage, the potential levels of two adjacent storage nodes 609 need only be held at those different from each other, for example, high (H) level and low (L) level. Thus, if there is leakage between memory cells, a read data will be read as defective data which is different from an expected value. Also, application of voltage stress allows any latent defection between the adjacent memory cells to appear as the time period during which the stress is applied is increased.

FIG. 32 is a conceptual view of a two-dimensional data arrangement when data of potential levels different from each other are written into physically adjacent memory cells.

In FIG. 32, 2K (accurately, 2048) memory cells are arranged in the X direction (the row direction).

When data the potential levels of which are different from each other are written into physically adjacent memory cells, as described above, the pattern of written data will be ultimately a pattern of a so-called checker flag (referred to as a checker pattern hereinafter). More specifically, L and H levels are written corresponding to black and white squares the checker flag, respectively.

In order to externally write data in such a checker pattern, however, the correspondence between an address externally applied and an internal address need be taken into consideration beforehand in externally applying the address signal, since a recombination is performed between an externally applied row address signal and an internal address actually selected in DRAM 2000, as described above.

Furthermore, in writing data in such a checker pattern as shown in FIG. 32, effects of address signal scrambling as well as effects of data scrambling as described below need be taken into consideration.

FIG. 33 is a circuit diagram showing a configuration of a pair of bit lines, word lines and memory cells corresponding to a specific column in memory cell array 100, and sense amplifier connected to the pair of bit lines.

It is assumed that there are n+1 word lines WL to which numbers 0–n are allocated in order.

A memory cell is connected corresponding to an intersection of a pair of bit lines BL and /BL and a word line WL. Each memory cell includes a memory cell capacitor MC which receives a cell plate potential at one end, and a memory cell transistor MT connected between the other end of memory cell capacitor MC and a corresponding bit line and having its gate connected to a corresponding word line WL. A memory cell the word line WL number for which is an even number is connected to bit line BL, and a memory cell the word line WL number for which is an odd number is connected to bit line /BL.

Thus, if an H level is written into all of the memory cells, for example, a potential level to be applied to the pair of bit lines BL and /BL will be different depending on whether each memory cell is connected to a word line WL of an even or odd number.

FIG. 34 schematically shows a correlation between data to be written into, that is, a potential level to be applied to bit line BL in writing data into such a memory cell and a potential level output on bit line BL in reading data from the memory cell. As described above, a potential level applied to bit line BL differs even in writing same data depending on whether a memory cell into which the data is to be written is connected to a word line (a row) of an even or odd number.

Hereinafter, /η represents a logic operation which determines a potential level (a logic level) to be applied to bit line BL for write data Din externally applied, wherein / represents an inverted operation of an logic operation and thus an operation /η represents an inverted logic operation of an operation η.

Referring to FIG. 34, logic operation /η corresponds to an exclusive OR operation of the least significant bit A0R of a physical address of word line WL and write data Din. More specifically, when the least significant bit A0R of a physical address attains an L level, that is when it corresponds to a word line of an even number, write data Din externally applied passes through an exclusive logic OR operation circuit 144 receiving signals A0R and Din and is transparently applied to a memory cell. In contrast, when signal A0R attains an H level, that is, when it corresponds to a word line of an odd number, write data Din is inverted by exclusive OR operation circuit 144 and thus applied to the memory cell.

In reading data, an output of an exclusive OR operation circuit 146 which receives both data output from the memory cell and signal A0R is entirely similarly output as read data Dout.

FIG. 35 is a schematic block diagram showing a process of address scramble and written data scramble in data writing.

In FIG. 35, /ϕ represents a logic operation for such a conversion of a physical address into an internal address as shown in FIG. 28.

A logic operation /ϕ is applied to A0–Ai input to an external address input terminal 110, which are then input to memory cell 100. Meanwhile, a logic operation /η is applied to written data Din input to data input terminal 160, which is then applied to the memory cell.

In fact, a circuit for performing such an operation /ϕ or /η does not exist, and arranging of word lines and bit lines merely bring about a result equivalent to the execution of such an operation. Hereinafter, however, in order to simplify the description, it is assumed that such operations are applied to externally applied address signals A0–Ai and externally applied written data Din to select a memory cell, write data and the like.

As described above, in writing data into a selected memory cell, a recombination operation is equivalently performed with a predetermined correspondence between an externally applied address signal and physical address actually selected on a memory cell array. Furthermore, with respect to writing data itself, a result of execution of a predetermined logic operation is equivalently written into the selected memory cell. Thus, in order to write data in such a checker pattern as shown in FIG. 32 into the memory cell array by externally applying an address signal and written data, it is necessary to take it into consideration that logic operations /ϕ and /η are internally performed, preperform inverted versions thereof, that is, preperform operation ϕ for an address signal and operation η for written data and to perform operation /ϕ for the address signal and operation /η for the written data within DRAM 2000 so that desired data is written into a desired memory cell.

More specifically, it is necessary to prepare an inherent software for writing data depending on the configuration of a DRAM.

In burn-in testing or the like, conventionally a semiconductor memory device of interest is connected to a tester and a reading/writing processing of data is performed per memory cell.

In this case, the tester includes a fail bit map and a test result for each memory cell such as fail/pass is recorded at a corresponding bit on the fail bit map.

Furthermore, the tester is mounted with a software which address-scrambles the value of an address to be supplied, depending on address mapping of a semiconductor memory device to be tested. Such a function of the software allows the test result of each memory cell described above to be recorded on the above fail bit map not at a bit corresponding to an address value based on the address decode logic of the semiconductor memory device but at a bit located at a physically corresponding position. This allows the physical location of any defective bit on a memory cell array to be specified through analysis of the above fail bit map. For example, a cause of defection such as interference between memory cells can be elucidated.

For a conventional technique in which address scrambling is performed in the tester using a software, however, specifying and analyzing the location of a defective bit has the following problems.

Firstly, a software need be prepared which corresponds to the address mapping of a memory cell array. More specifically, if a semiconductor memory device to be tested has different function and configuration, the physical arrangement order of each memory cell and the address mapping defined according to the decode logic are also different. Thus, a software is required which is provided with a logic of address scrambling corresponding to a semiconductor memory device for each address mapping inherent to the semiconductor memory device.

Secondly, address scrambling which can be achieved using a software is limited depending on the processing capability of the tester. For example, when a semiconductor memory device with a complex address arrangement such as hierarchical address mapping configuration is tested, the software for address scrambling is complicated. Thus, processing capability is insufficient depending on the specification of a tester and semiconductor memory device testing for evaluation may not be able to be conducted.

Thirdly, in burn-in testing or the like, data in a so-called checker pattern is written into a memory cells arranged in a matrix so that any initial defection due to leakage current between memory cells is revealed, as described above. More specifically, an H level and an L level in two dimension are alternately written into physically adjacent memory cells. This allows voltage stress to be applied between the physically adjacent memory cells.

It is necessary in writing such a checker pattern into memory cells, however, to independently develop a software for performing such data writing for each semiconductor memory device, taking into consideration the address scrambling mentioned above.

Furthermore, other than the problem of the software on the tester side with the necessity of the address scrambling described above, there also is the problem described below.

A conventional burn-in testing is conducted on semiconductor memory devices after the final assembling process such as mold packaging is completed. However, a semiconductor memory device in which some initial defection has been found in burn-in testing is not shipped as a product and thus the manufacturing cost for assembling for such a chip is wasted.

If burn-in testing is conducted on a wafer, for example, and any defective chip can thus be revealed and be removed prior to assembling process, such a manufacturing cost can be reduced.

It is necessary in burn-in testing a semiconductor memory device chip in the form of a wafer, however, to typically apply an address signal or a control signal and written data and the like for each chip and carry out testing with a considerable number of probe needles in contact with each chip.

However, the contact of such probe needles with each chip over the entire surface of a wafer is physically difficult to achieve and furthermore the tester side is extremely burdened with performance of such parallel testing.

SUMMARY OF THE INVENTION

One object of the present invention is to provide a semiconductor memory device capable of reduction in testing time period by conducting burn-in testing without taking into consideration the configuration of a memory cell array.

Another object of the present invention is to provide a semiconductor memory device capable of writing checker pattern data into a memory cell array without taking into consideration the configuration of a memory cell array.

Still another object of the present invention is to provide a semiconductor memory device capable of reducing the number of signals externally applied thereto and of reducing the number of probe needles necessary for each chip in the form of a wafer in burn-in testing, that is, a semiconductor memory device capable of being burn-in tested in the form of a wafer.

Still another object of the present invention is to provide a semiconductor memory device capable of writing checker pattern data into a memory cell array in burn-in testing the semiconductor memory devices in the form of a wafer.

In summary, the present invention contemplates a semiconductor memory device including a plurality of pairs of bit lines, a plurality word lines, a memory cell array, an operating mode setting circuit, an internal address generation circuit, a memory cell select circuit and an internal data generation circuit.

The plurality of word lines intersects the plurality of pairs of bit lines. The memory cell array includes a plurality of memory cells arranged in a matrix corresponding to intersections of pairs of bit lines and word lines, and each holding one of binary data. The operating mode setting circuit activates a first operating mode according to an external indication. The internal address generation circuit cyclically outputs an internal address which sequentially selects a memory cell corresponding to a physical address in response to the activation of the first operating mode signal. The memory cell select circuit selects a corresponding memory cell in response to the internal address signal and writes data. The internal data generation circuit outputs internal written data to the memory cell select circuit depending on the arrangement of the plurality of pairs of bit lines, a plurality of word lines and of a plurality of memory cells so that binary data in a checker pattern are written into memory cells sequentially selected by the internal address signal.

In another aspect of the present invention, a semiconductor memory device separated as a chip from a semiconductor substrate on which it is formed includes a processing margin region, a power supply terminal and an interconnection. The processing margin region is located at the most peripheral portion of the chip surface and provides a margin for processing in separation processing. The power supply terminal is arranged in an internal region on the chip surface surrounded by the processing margin region and externally receives a power supply potential. The interconnection extends from the power supply terminal to the processing margin region.

Thus, the main advantage of the present invention is that binary data in a checker pattern is written into memory cells according to an external indication and thus burn-in testing can be conducted without externally taking the configuration of a memory cell array into consideration. This allows reduction in time and cost required for testing.

Another advantage of the present invention is that the number of probe needles required for each chip in burn-in testing can be reduced.

Thus, burn-in testing can be conducted on a semiconductor memory device in the form of a wafer, the cost of testing can be reduced by parallel testing, and assembling cost for defective chips can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a first correspondence diagram showing a correlation between data Dcell written into a memory cell and externally applied written data Din.

FIG. 15 is a second correspondence diagram showing a correlation between data Dcell and data Din.

FIG. 32 shows a checker pattern written into memory cells in burn-in testing.

DESCRIPTION OF THE PREFERRED EMBODIMENTS

First Embodiment

Figure 1:
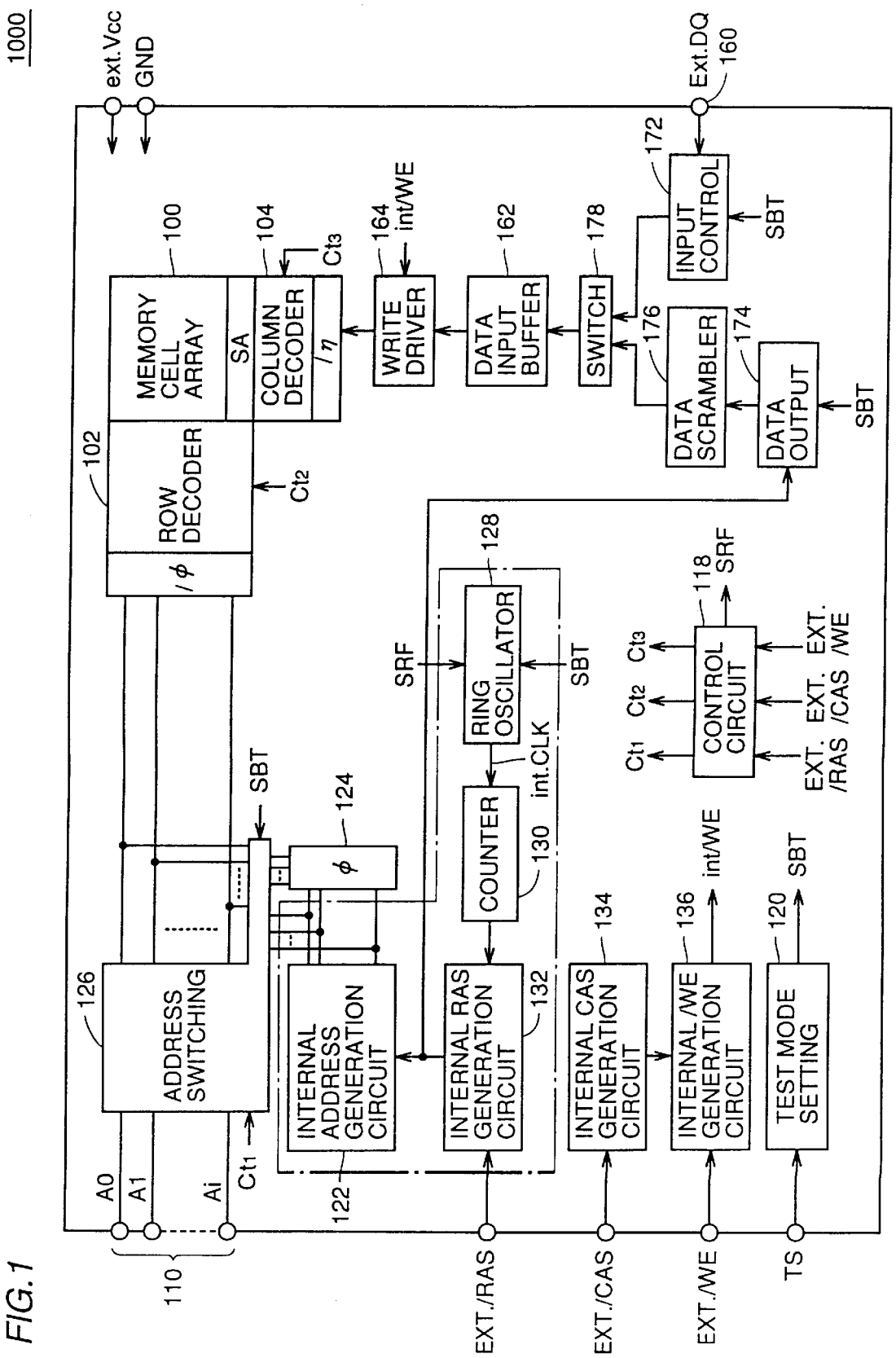
FIG. 1 is a schematic block diagram showing a configuration of a semiconductor memory device 1000 according to a first embodiment of the present invention.

FIG. 1 is a schematic block diagram showing a configuration of a semiconductor memory device 1000 according to a first embodiment of the present invention.

Referring to FIG. 1, semiconductor memory device 1000 includes a control circuit 118 which receives external control signals EXT./WE, EXT./RAS and EXT./CAS to generate various internal control signals, a memory cell array 100 having memory cells arranged in a matrix, an internal row address generation circuit 122 which generates an internal row address signal which specifies a row selected in a refresh operation or burn-in test operation under the control of control circuit 118, an operation circuit 124 which receives an output of internal row address generation circuit 122 and performs operation φ for outputting, an address switch circuit 126 which receives an external address signal A0–Ai applied via an address signal input terminal 110, an output of internal row address generation circuit 122 and an output of operation circuit 124 under the control of control circuit 118 and switches to output the address signal input to address signal input terminal 110 in the normal mode of operation, the output of operation circuit 124 while the burn-in mode is designated by a signal SBT and the signal output from internal row address generation circuit 122 while a self-refresh mode designation signal SRF output from control circuit 118 is activated, for application to row decoder 102.

Semiconductor memory device 1000 also includes a ring oscillator 128 which outputs an internal clock int.CLK of a predetermined frequency when the burn-in mode or self-refresh mode is designated, a counter 130 which receives internal clock int.CLK and counts a predetermined number of periods, an internal RAS generation circuit 132 which receives an output of counter 130 and an externally applied row address strobe signal EXT.RAS and outputs an internal row address strobe signal int./RAS in response to signal EXT./RAS in a normal operation and outputs a signal int./RAS in response to an output from counter 130 when the burn-in test mode or self-refresh mode is designated, an internal CAS generation circuit 134 which receives externally applied EXT.CAS and an output from counter 130 and outputs an internal column address strobe signal int./CAS in response to signal EXT./CAS in a normal operation and outputs a signal int./CAS in response to an output of counter 130 when the burn-in mode is designated, an internal /WE generation circuit 136 which receives externally applied write enable signal EXT./WE and outputs an internal write enable signal int./WE for activating an writing operation, and row decoder 102 which is activated under the control of control circuit 118 and decodes a row address signal output from address switch circuit 126 to select a row in memory cell array 100.

It should be noted that signal EXT./WE is a write enable signal which designates data writing and that signal /RAS is a row address strobe signal which initiates an internal operation of semiconductor memory device 1000 and also determines the time period during which the internal operation is activated.

When signal EXT./RAS is activated, a circuit related to an operation of selecting a row of memory cell array 100, such as row decoder 102, is activated. Signal EXT./CAS is a column address strobe signal and activates a circuit which selects a column in memory cell array 100.

Semiconductor memory device 1000 also includes a column decoder 104 which is activated under the control of control circuit 118 and decodes a column address signal from address switch circuit 126 to generate a column select signal for selecting a column in memory cell array 100, and an input control circuit 172 which receives and outputs external written data EXT.DQ input to a data input terminal 160 in writing data under the control of control circuit 118. Input control circuit 172 is inactivated while signal SBT is activated and the burn-in mode is designated.

Semiconductor memory device 1000 also includes a data output circuit 174 which outputs external written data when the burn-in mode is designated, a data scrambler 176 which performs a predetermined logic operation on data of the data output circuit, a switch 178 which receives an output of input control circuit 172 and an output of data scrambler 176 and switches to output the output from data scrambler 176 in the burn-in mode and the output from input control circuit 172 in a normal operation, a data input buffer 162 which receives, buffers and outputs an output from switch 178, and a write driver 164 which receives an output of data input buffer 162, is activated in response to signal int./WE and outputs internal written data to memory cell array 100.

It should be noted that semiconductor memory device 1000 receives an external power supply voltage ext.Vcc which is externally applied and a ground potential GND.

Figure 35:
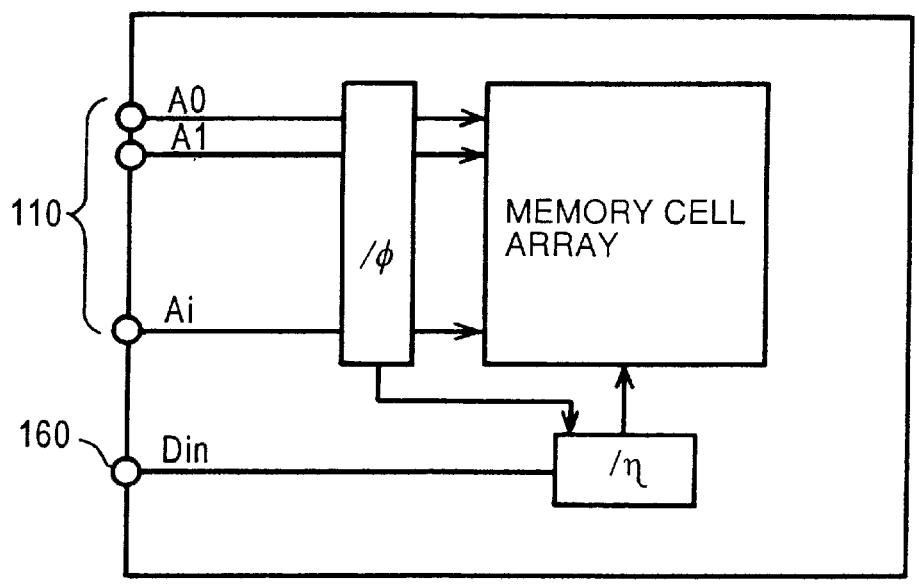
FIG. 35 is a conceptual diagram for illustrating a scrambling processing in an operation of writing data into a memory cell.

Furthermore, as described with reference to FIG. 35, an address signal applied to memory cell array 100 has equivalently experienced logic operation /φ and written data applied to memory cell array 100 has equivalently experienced logic operation /η.

Thus, in the burn-in test mode when a memory cell is selected according to the data resulting from a logic operation φ performed in operation circuit 124 on an internal row address signal output from internal row address generation circuit 122, that memory cell in memory cell array 100 a physical address of which is the address generated in the internal row address generation circuit is selected.

Meanwhile, data scrambler 176 performs a logic operation on an output of data output circuit 174 depending on the pattern of data to be written and thus a desired data pattern such as a checker pattern can be written corresponding to physical addresses of memory cell array 100 after logic operation /η is performed in writing data into memory cell array 100.

Figure 2:
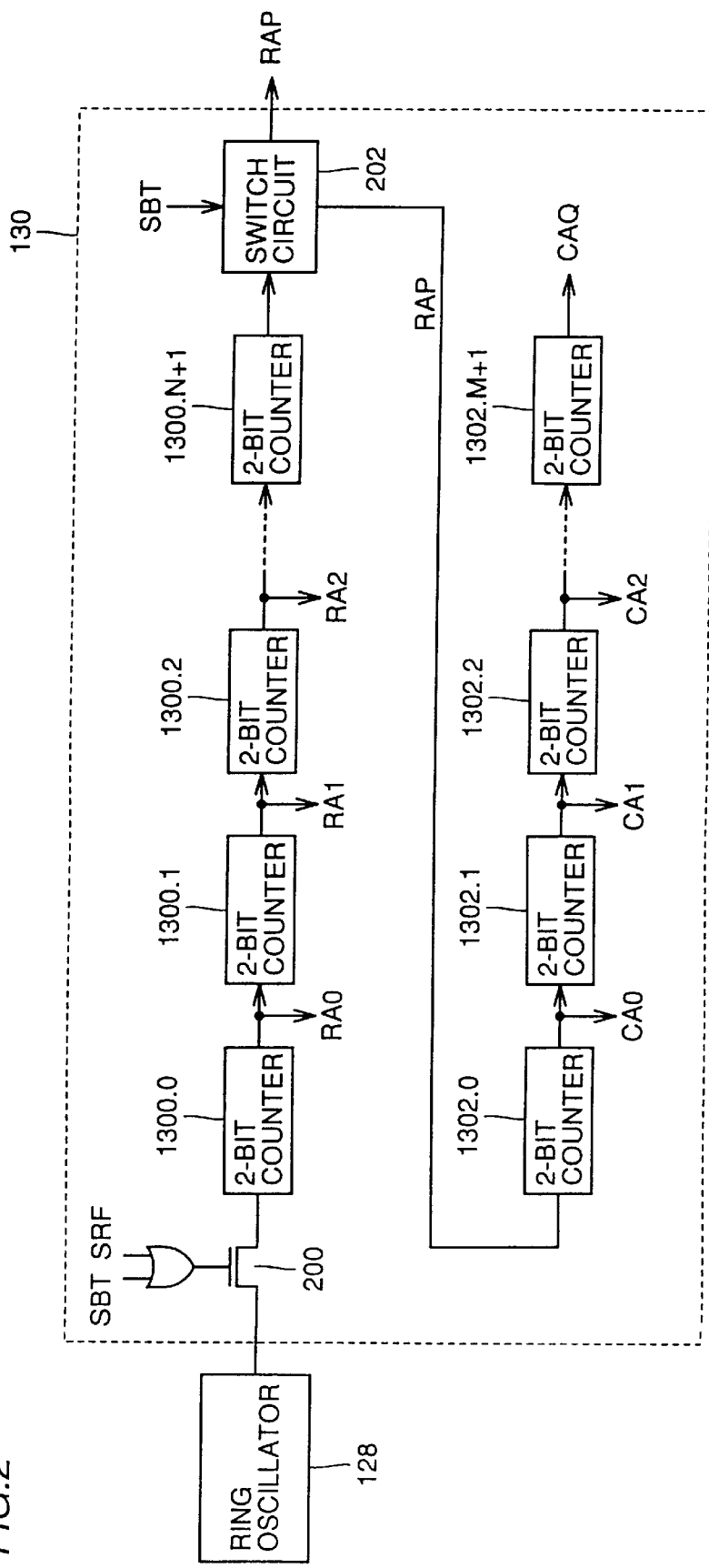
FIG. 2 is a schematic block diagram showing a configuration of a counter circuit 130 shown in FIG. 1.

FIG. 2 is a schematic block diagram showing a configuration of ring oscillator 128 and counter 130 shown in FIG. 1.

Ring oscillator 128 is, as described later, activated in response to activation of a signal SBT or SRF and outputs a predetermined internal clock signal int.CLK.

Counter 130 includes two-bit counters 1300.1–1300.n+1 which are connected in series and receive an output from ring oscillator 128 to sequentially output a row address signal. Two-bit counter 1300.1 receives an output of ring oscillator circuit 128 via a transistor 200 which is turned on in response to activation of signal SBT or SRF, and applies a signal RA0 to internal RAS generation circuit 132. Two-bit counter 1300.2 connected to two-bit counter 1300.1 applies signal RA1 to internal RAS generation circuit 132. Similarly, two-bit counter 1300.n outputs a signal RAn.

Two-bit counter 1300.n+1 also outputs a carry signal RAP. Counter 130 also includes a switch 202 which receives carry signal RAP which is output to two-bit counter 1302.0 at the subsequent stage when signal SBT is activated.

Counter circuit 130 also includes two-bit counters 1302.0–1302.m+1 which are connected in series. Two-bit counters 1302.0 and 1302.2 connected thereto in series output column address signals CA0 and CA1, respectively. Similarly, two-bit counter 1300.m outputs a column address signal CAm.

Furthermore, two-bit counter 1300.m+1 outputs a carry signal CAP.

Thus, when the self burn-in test mode is not designated, counter circuit 130 sequentially counts up and thus outputs row addresses RA0–RAn according to an output from ring oscillator 128.

When the burn-in mode is designated, row addresses are sequentially counted up, all word lines are selected and then a column address is increased by one.

Such a configuration allows all memory cells to be sequentially selected in the burn-in mode. A column address is fixed during one cycle of row selecting.

Figure 3:
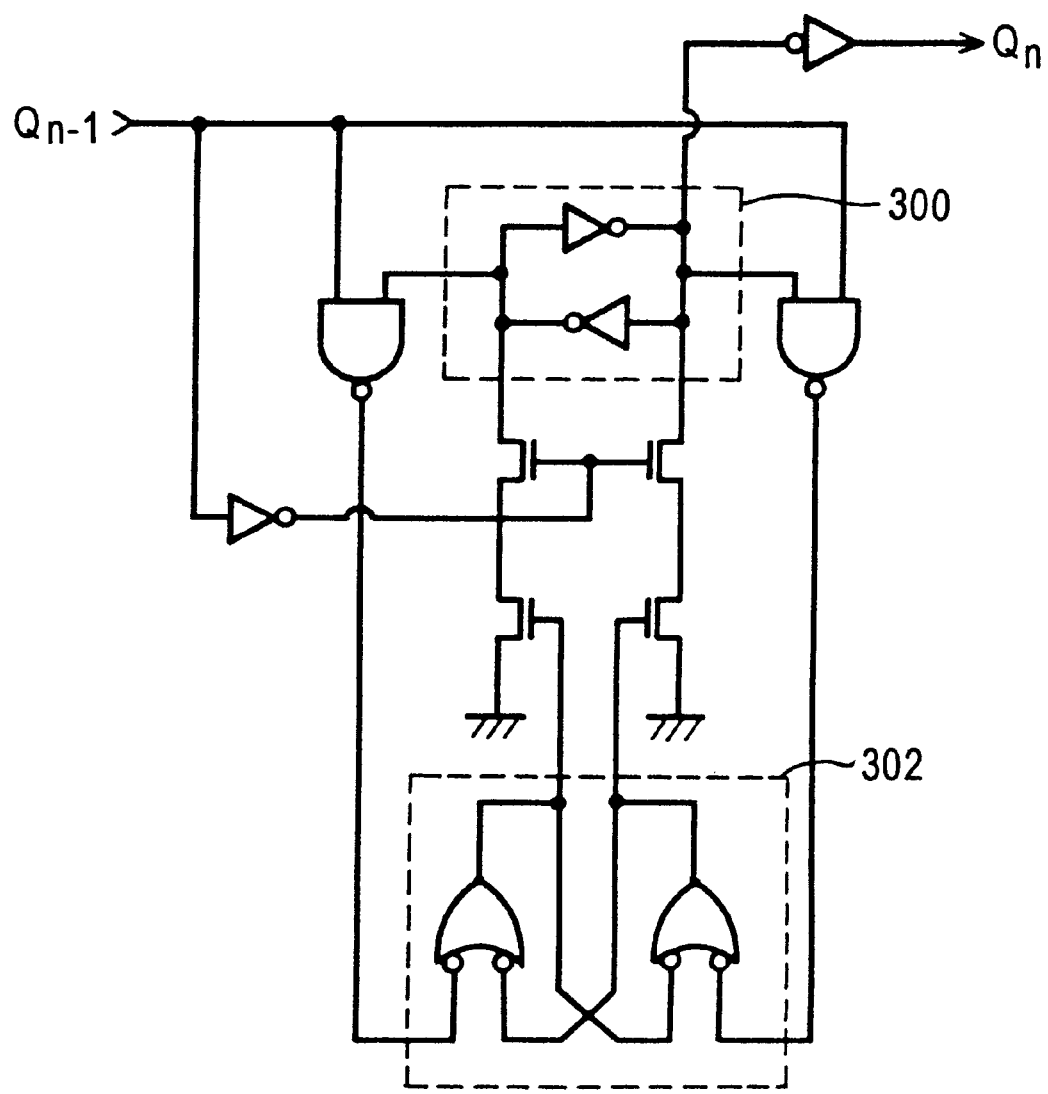
FIG. 3 is a circuit diagram showing a configuration of the two-bit counter shown in FIG. 2.

FIG. 3 is a circuit diagram showing a configuration of two-bit counters 1300.0–1300.n+1 or 1302.0–1302.m+1.

The two-bit counter receives a signal Qn−1 as an input and inverts the level of an output signal Qn for each two-cycle change of signal Qn−1. Basically, two latch circuits 302 and 300 are connected in series and the state of first-stage latch circuit 302 and the state of subsequent-stage latch circuit 300 are sequentially inverted in response to input signal Qn−1 to output a corresponding output signal Qn.

The configuration of such a two-bit counter is well known and thus the configuration and operation thereof is not described.

Figure 4:
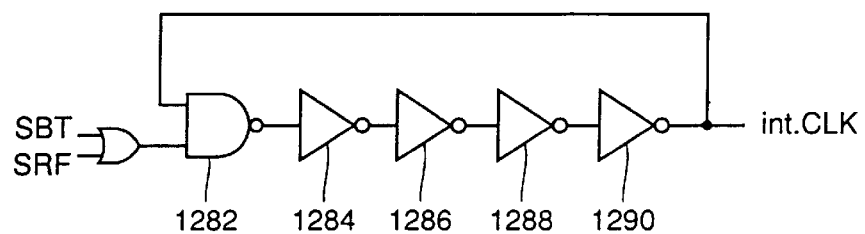
FIG. 4 is a schematic block diagram showing one example of a configuration of a ring oscillator 128 shown in FIG. 1.

FIG. 4 is a circuit diagram showing one example of a configuration of the ring oscillator shown in FIG. 2.

Ring oscillator 128 includes an NAND circuit 1282 receiving the OR of signals SBT and SRF as one input, and inverters 1284–1290 connected in series and receiving an output of NAND circuit 1282. An output of inverter 1290 corresponds to internal clock signal int.CLK. The output of inverter 1290 is also connected to the other input node of NAND circuit 1282.

Thus, a configuration as shown in FIG. 4 allows internal clock signal int.CLK to be output when signal SBT is activated.

It should be noted that the number of inverter stages can be increased or decreased to set the period of internal clock signal int.CLK at a predetermined value.

Figure 5:
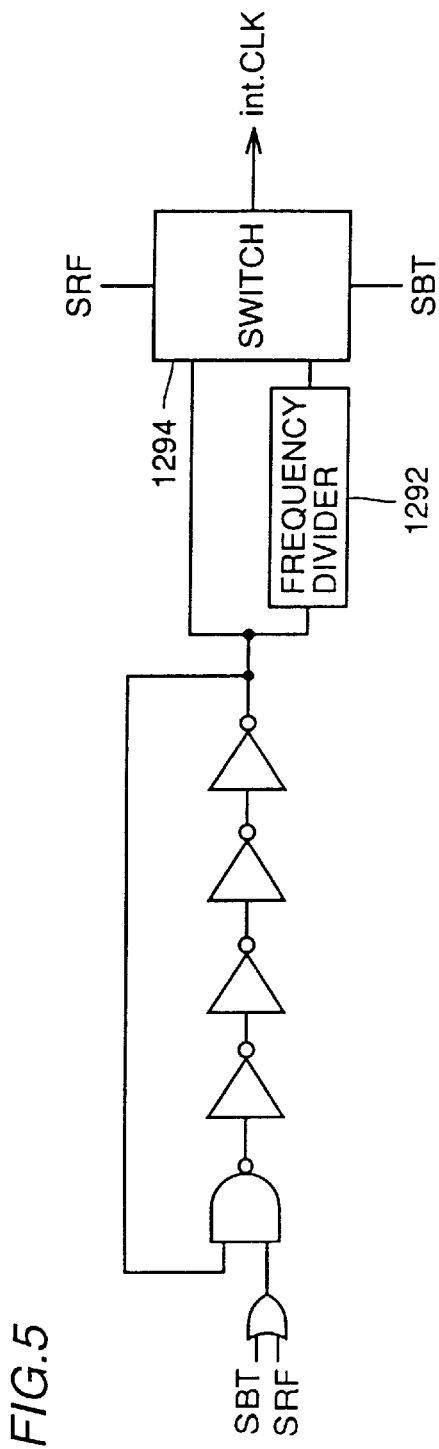
FIG. 5 is a schematic block diagram showing another example of a configuration of ring oscillator 128 shown in FIG. 1.

FIG. 5 is a schematic block diagram showing another example of the configuration of ring oscillator 128 shown in FIG. 2.

It differs from the configuration of the ring oscillator shown in FIG. 4 in that it includes a frequency divider 1292 which receives and reduces the period of an output of inverter circuit 1290, and a switch circuit 1294 which receives an output of inverter 1290 and an output of frequency divider 1292, and outputs the output of frequency divider 1292 when signal SBT is activated and the burn-in mode is designated, and transparently outputs the output of inverter 1290 when signal SRAF is activated and the self-refresh mode is designated.

Thus, such a configuration of the ring oscillator as shown in FIG. 5 allows an internal address to be changed faster during a burn-in mode test period.

More specifically, during a burn-in test period, a memory cell in memory cell array 100 is selected in response to an address signal changing at high speed and data output from data output circuit 174 is written into a corresponding memory cell. In the self-refresh mode, each row of memory cell array 100 is sequentially selected according to an oscillation frequency output from inverter 1290 and a refresh operation for memory cell array 100 is performed.

Figures 6, 7:
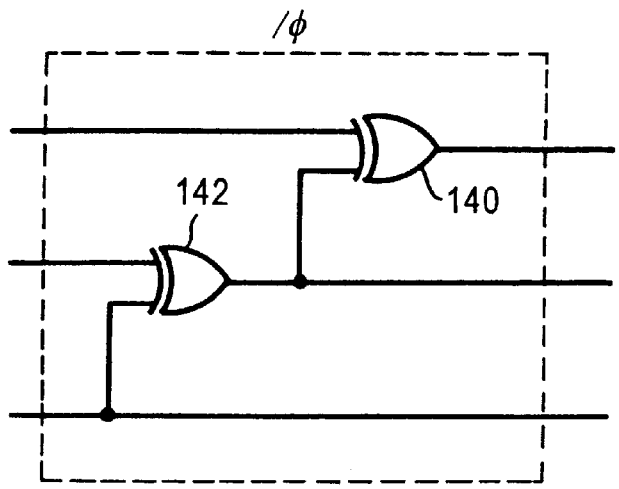
FIG. 6 is a circuit diagram showing a logic circuit corresponding to address scrambling.
FIG. 7 is a view for illustrating an operation of the logic circuit shown in FIG. 6.

FIG. 6 is a circuit diagram showing a configuration of that logic operation circuit in row decoder 102 which performs operation /φ in response to an externally applied address signal to generate an address signal for actually selecting a memory cell array. FIG. 6 shows the three least significant bits which is subject to address recombination. More specifically, an output of an exclusive OR circuit 142 receiving the second and third least significant bit signals A1R and A2R of an applied address signal is output as an address RA1 for selecting a memory cell. An output of an exclusive OR circuit 140 receiving signal RA1 and an externally applied address signal A0R is output as a signal RA0.

FIG. 7 is a correspondence diagram showing such a recombination of the three least significant bit address signals.

As shown in FIG. 7, operation /φ allows data 0, 1, 2, 3, 4, 5, 6, 7 to be substituted with 0, 1, 3, 2, 7, 6, 4, 5, respectively.

Figures 8, 9:
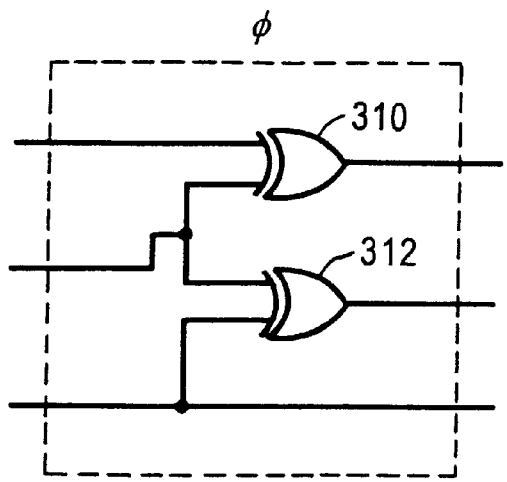
FIG. 8 is a circuit diagram showing a logic circuit corresponding to an inverted operation processing of the address scrambling.
FIG. 9 is a view for illustrating an operation of the logic circuit shown in FIG. 8.

FIG. 8 is a circuit diagram showing a circuit which performs operation φ, the inverted version of logic operation /φ shown in FIG. 6. An output of an exclusive OR circuit 310 receiving the least significant bit signal RA0 and the second least significant bit signal RA1 of an input signal is output as signal A0R. An output of an exclusive OR circuit 312 receiving signals RA2 and RA1 is output as signal A1R.

FIG. 9 is a correspondence diagram showing a correlation between the input and output of logic operation φ.

Logic operation φ allows input data of 0, 1, 2, 3, 4, 5, 6, 7 to be substituted with 0, 1, 3, 2, 6, 7, 5, 4, respectively.

Such a logic operation φ as shown in FIG. 9 is performed by operation circuit 124 for outputting. It should be noted that in FIG. 9, only the three least significant bits of an address signal are substituted by logic operation /φ and thus the inverted operation is illustrated with respect to the three least significant bits only.

In the self burn-in test mode, as shown in FIG. 1, an output from operation circuit 124 is applied to row decoder 102 via address switch circuit 126 and thus operation /φ is equivalently performed for selecting a memory cell. Thus, when seen from internal row address generation circuit 122, operation circuit 124 performs logic operation φ on an address signal output from internal row address generation circuit 122 and then operation /φ as the inverted version of logic operation φ is performed in an actual memory cell selecting operation to select a memory cell. Thus, an address output from internal row address generation circuit 122 matches a physical address of a memory cell selected in memory cell array 100.

Figures 10, 11:
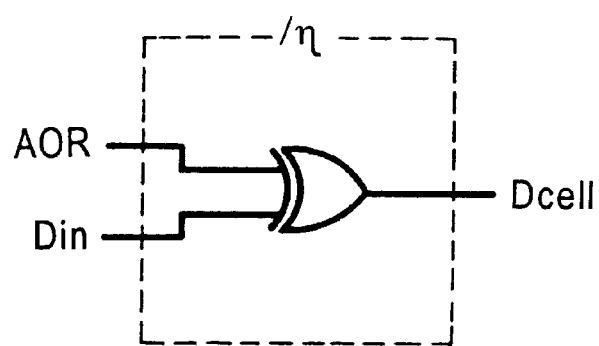
FIG. 10 is a circuit diagram showing a logic circuit corresponding to data scrambling.
FIG. 11 is a view for illustrating an operation of the logic circuit shown in FIG. 10.

FIG. 10 shows a configuration of a logic circuit corresponding to logic operation /η corresponding to data scrambling performed for effectively and externally applied written data Din in writing data into a memory cell array. More specifically, a result of an exclusive OR operation of written data Din and address signal A0R serves as data Dcell written into a memory cell.

FIG. 11 is a diagram for illustrating an operation of the /η logic operation circuit shown in FIG. 10. More specifically, when the least significant bit A0R of a row address is 0, externally applied written data Din matches data Dcell written into a memory cell. When the least significant bit A0R of a row address signal is 1, data Dcell written into a memory cell is the inverted version of externally applied written data Din.

FIG. 11 shows a circuit which performs logic operation η as the inverted version of logic operation /η shown in FIG. 10.

More specifically, an exclusive OR operation result of the least significant bit signal A0R of a row address signal and data Dcell written into a memory cell corresponds to externally applied written data Din.

Figures 12, 13:
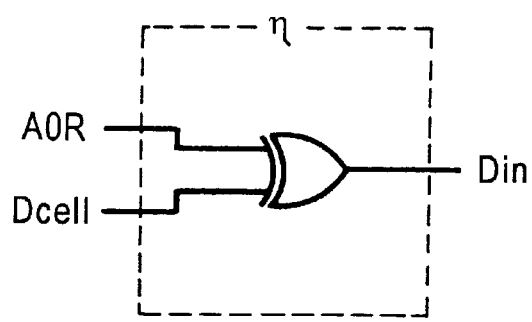
FIG. 12 is a circuit diagram showing a configuration of a logic circuit corresponding to an inverted operation processing of the data scrambling.
FIG. 13 is a diagram for illustrating an operation of the logic circuit shown in FIG. 12.

FIG. 13 is a diagram for illustrating an operation of logic operation circuit η shown in FIG. 12. When signal A0R is 1, the inverted version of signal Dcell serves as signal Din and it is thus found in comparison with FIG. 11 that the circuit operation in FIG. 12 is the inverted version of logic operation /η.

FIG. 14 shows written data to be externally applied when such a checker pattern as shown in FIG. 32 is written into memory cells. More specifically, FIG. 14 shows that L level data Dcell is written into a memory cell connected a word line the number of which is an even number and H level data Dcell is written into a memory cell connected to a word line the number of which is an odd number. As described with reference to FIG. 12, a result of application of logic operation η to signal Dcell serves as data Din to be written as external data. Referring to FIG. 13, it is found that when such a logic operation is performed on data Dcell, written data Din need only be fixed at L level for memory cells connected to all word lines.

In contrast to FIG. 14, FIG. 15 shows a correspondence between data Dcell and data Din when H level data Dcell is written into a memory cell connected to a word line the number of which is an even number and L level data Dcell is written into a memory cell connected to a word line the number of which is an odd number.

As is similar to FIG. 14, it is found that when logic operation η is applied to data Dcell, written data Din need only be fixed to H level.

That is, such a checker pattern as shown in FIG. 32 can be written into memory cells simply by fixing written data alternately at H and L levels for each column.

It should be noted that such a logic operation φ or η as described above is changed depending on the arrangement of memory cells, word line and pairs of bit lines in a memory cell array.

Accordingly, the level of data applied as written data when such a checker pattern as shown in FIG. 32 is written into memory cells need be changed depending on the configuration of each semiconductor memory device.

Figure 16:
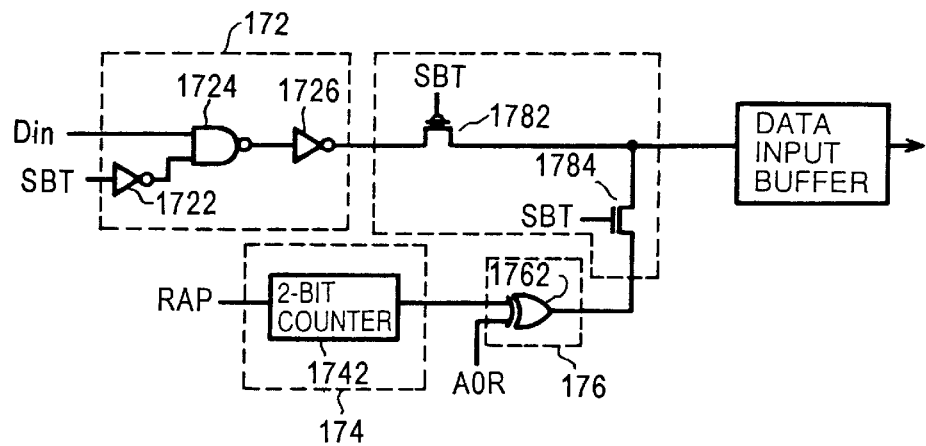
FIG. 16 is a schematic block diagram showing a configuration of an input control circuit 172, a data output circuit 174, a data scramble circuit 176 and switch 178.

FIG. 16 is a schematic block diagram showing a configuration of input control circuit 172, data output circuit 174, data scrambler 176 and switch circuit 178 shown in FIG. 1.

Input control circuit 172 includes an NAND circuit 174 which receives externally applied written data Din at one input and also receives an signal inverted from signal SBT by inverter 1722 at the other input, and an inverter 1726 which inverts and outputs an output of NAND circuit 1724.

Thus, while signal SBT is inactivated, NAND gate 1724 is closed.

Data output circuit 174 includes a two-bit counter 1722 which receives the most significant bit RAn of a row address signal output from counter circuit 130.

Data scrambler circuit 176 includes an exclusive OR circuit 1762 which receives a signal ZAQ0 as an output of two-bit counter 1742 and the least significant bit A0R of a row address signal. Switch 178 includes a p channel MOS transistor 1782 which shuts off the connection between write driver circuit 182 and inverter circuit 1726 in response to activation of signal SBT (i.e., when signal SBT attains an H level), and an n channel MOS transistor 1784 which renders conducting an output of data scrambler 176 and write driver circuit 182 in response to activation of signal SBT.

Thus, while signal SBT is inactivated, externally applied written data Din is applied to write driver circuit 182. While signal SBT is activated, data from data output circuit 174 is applied to write driver circuit 182.

Figure 17:
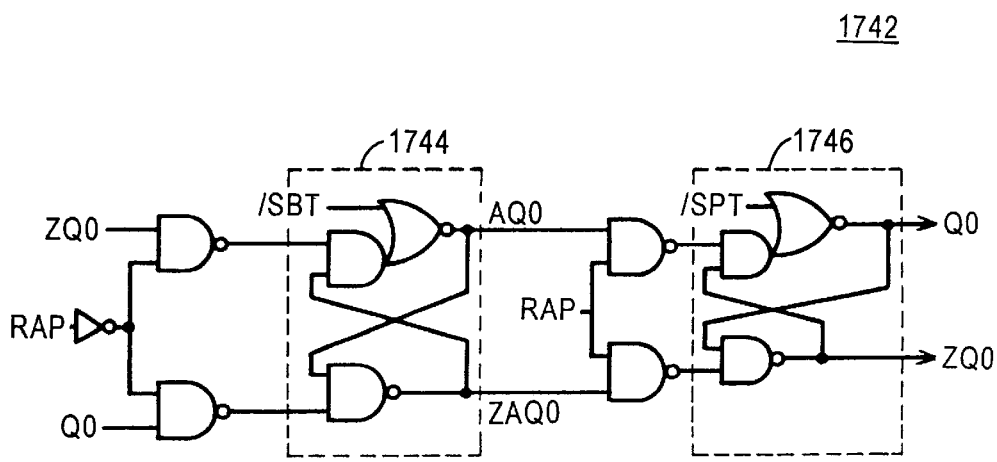
FIG. 17 is a schematic block diagram showing a configuration of the two-bit counter shown in FIG. 16.

FIG. 17 is a schematic block diagram showing a configuration of two-bit counter 1742 shown in FIG. 16.

The two-bit counter shown in FIG. 17 also basically has a configuration in which a latch circuit 1744 at an initial stage is connected in series to a latch circuit 1746 at the subsequent stage. The configuration of the two-bit counter circuit is well-known except that it counts changes of signal RAn and that it is activated according to signal SBT (i.e., signal /SBT as an inverted version of signal SBT attains L level), and thus the configuration and operation thereof is not described.

A signal ZAQ0 output from the first latch circuit 1744 is output from data output circuit 174 to data scrambler 176.

Figure 18:
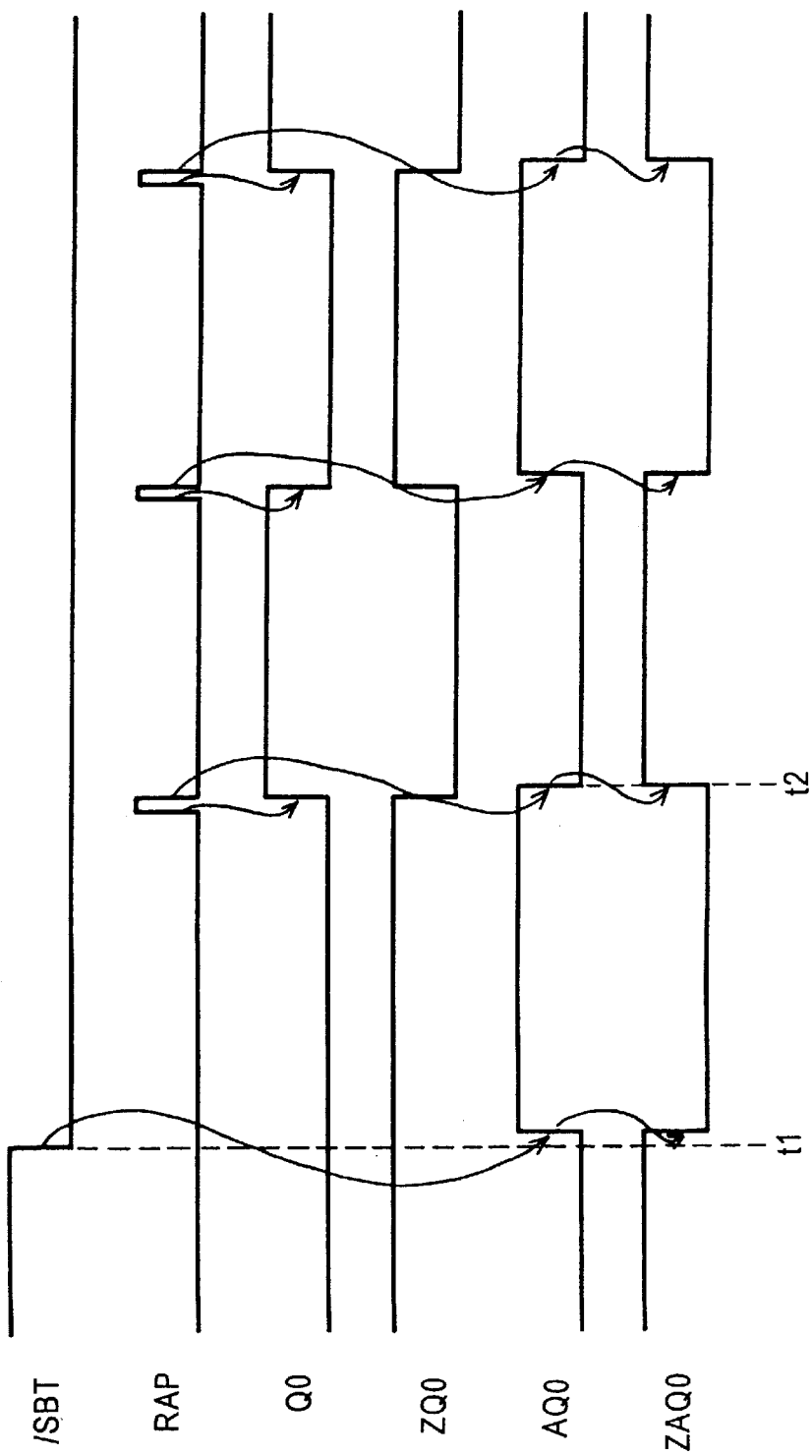
FIG. 18 is a timing chart for illustrating an operation of the two-bit counter shown in FIG. 17.

FIG. 18 shows a timing chart for illustrating an operation of the two-bit counter shown in FIG. 17.

At time instant t1 when signal /SBT attains an L level (corresponding to an activation of signal SBT and, more specifically, to entering the burn-in mode), latch circuits 1744 and 1746 are responsively activated and output signals AQ0 and ZAQ0 of latch circuit 1744 have their respective states inverted. More specifically, signal AQ0 is changed from an L level to an H level and signal ZAQ0 is changed from an H level to an L level.

Meanwhile, since the burn-in mode is entered, row address signals RA0–RAn are sequentially activated and output from counter 130. When all row selections are completed and carry signal RAP is activated, (i.e., attains an H level) in the counter circuit shown in FIG. 2, responsively at time instant t2 the level of signal Q0 is inverted. Furthermore, when a predetermined period of time has elapsed since time instant t2 and signal RAP is again inactivated (i.e., attains an L level), the levels of signals AQ0 and ZAQ0 are responsively inverted. Thus, the level of signal ZAQ0 is inverted in the burn-in test mode every select operation cycle for all rows.

During a selection operation cycle period for all rows, a column address is fixed. Thus, during the period from time instant t1 to time instant t2, for example, the output circuit outputs L level data and thus data Dcell written into memory cells has L and H levels alternately repeated, as shown in FIG. 14.

After one row select operation cycle when another select operation is started again from the first row, a column address has been increased by one, as is described with reference to FIG. 2, meanwhile, as described with reference to FIG. 18, written signal Din has its level inverted to an H level.

Thus, as described with reference to FIG. 15, the inverted version of the data written into the first column are sequentially written into memory cells at the second column.

Thus, such a checker pattern as shown in FIG. 32 can be written into memory cells.

Figure 19:
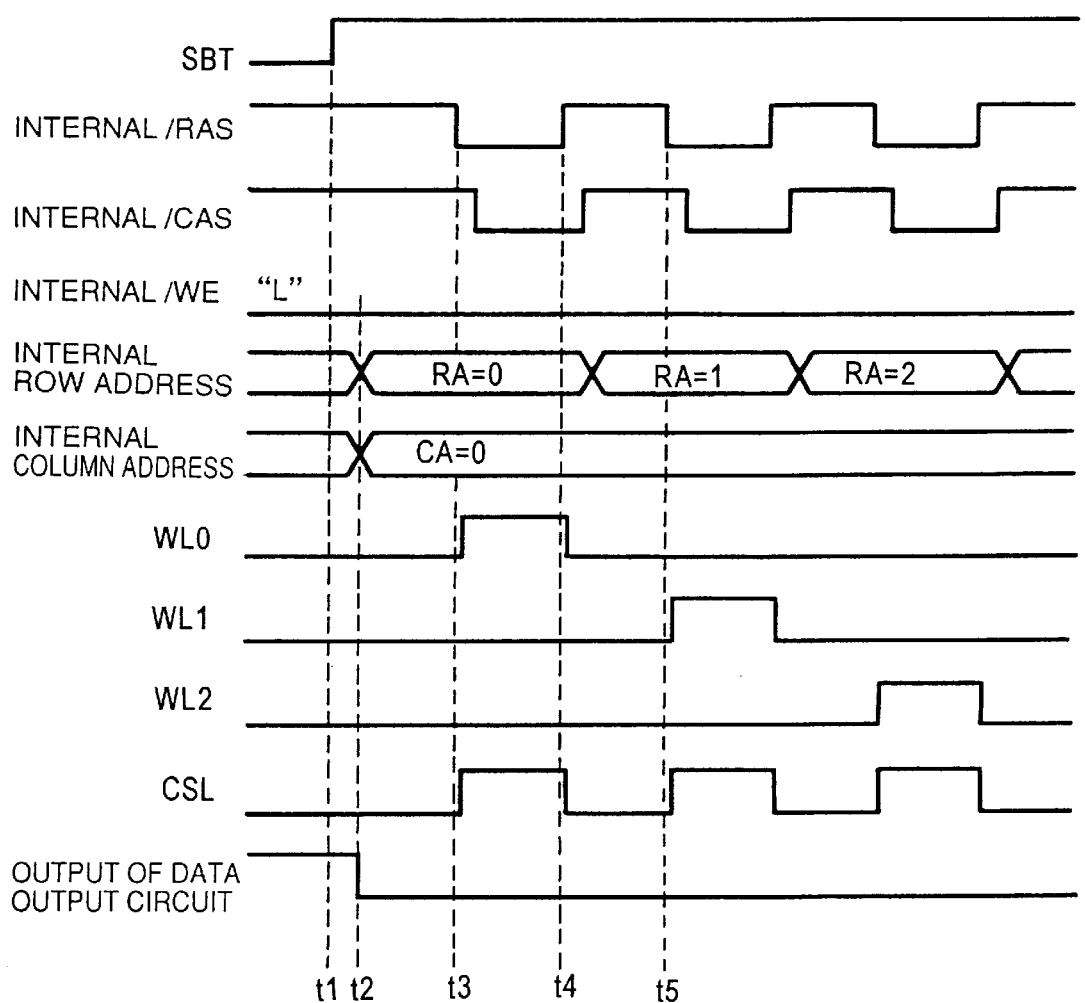
FIG. 19 is a timing chart for illustrating an operation of semiconductor memory device 1000 in the burn-in mode.

FIG. 19 is a timing chart for illustrating an operation of semiconductor memory device 1000 in the burn-in mode.

When burn-in mode designation signal SBT is activated (i.e., attains an H level) at time instant t1, the output level of data output circuit 174 responsively changes to an L level at time instant t2, as is described with reference to FIG. 18. Meanwhile, ring oscillator 228 starts an oscillation operation and counter 130 receives internal clock signal int.CLK and performs a counting operation. In response to an output from counter 130, internal row address generation circuit 122 outputs a row address signal which first selects the 0th row. Meanwhile, a column address signal output from counter 130 corresponds to the 0th column.

As described above, the column address maintains the state of CA=0 until one select operation cycle for all rows is completed.

Meanwhile, internal row address generation circuit 122 outputs an internal /RAS signal which changes at a predetermined time period of, for example, 1 μs. When the internal /RAS signal is activated (i.e., attains an L level) at time instant t3, a word line WL0 at a corresponding row is responsively selected (i.e., attains an H level). Meanwhile, in response to the activation of the internal /RAS signal at time instant t3, an internal /CAS signal output from internal CAS generation circuit 134 is also activated (i.e., attains an L level). Furthermore, a column select signal CSL which selects the row address CA=0 is also activated (i.e., attains an H level) and output data from data output circuit 174 is written into a memory cell connected to the corresponding column.

When the internal /RAS signal is inactivated (i.e., attains an H level) at time instant t4, the internal /CAS signal is responsively inactivated (i.e., attains an H level). Meanwhile, in response to the rising edge of the internal /RAS signal at time instant t4, that is, in response to an rising edge of internal clock signal int. CLK output from ring oscillator 128, a row address signal output from counter 130 is increased by one. With the inactivation of the internal /RAS signal, word line WL0 is put into a non-selected state and column select signal CSL is also inactivated.

Thereafter, similarly in response to activation of the internal /RAS signal (i.e., when the internal /RAS signal is changed to an L level), a corresponding word line WL is selected and column select signal CSL which selects a corresponding column (the column address CA=0 for the range shown in FIG. 19) is activated.

As described with reference to FIG. 18, output data from data output circuit 174 is held at an L level until one select operation cycle for all rows is completed.

In the burn-in test mode, according to an externally applied indication, data output from data output circuit 174 is sequentially written into a memory cell corresponding to an internal address generated within semiconductor memory device 1000 and a checker pattern as shown in FIG. 32 is thus written.

Thus, semiconductor memory device 1000 need only externally receive the three of external power supply potential ext.Vcc, ground potential GND and a test mode signal TS to perform a burn-in test operation.

Figure 20:
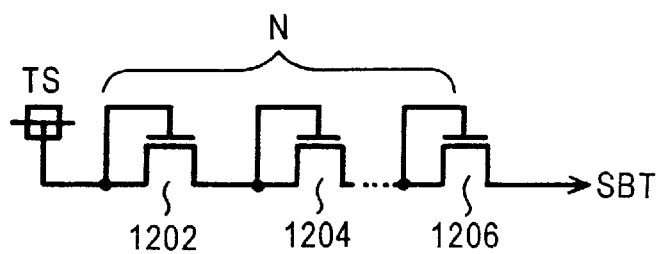
FIG. 20 is a circuit diagram showing an example of test mode setting circuit 120 shown in FIG. 1.

FIG. 20 is a circuit diagram showing a portion of a configuration of test mode setting circuit 120 shown in FIG. 1.

As shown in FIG. 20, n n-channel MOS transistors are provided which are connected in series from a test mode signal input terminal and are each diode-connected. The source potential of an n channel MOS transistor 1206 at the final stage of the series connection of n n-channel MOS transistors is equal to or more than power supply potential Vcc when the following relation is satisfied for the test mode input terminal:

$$V_{TS} > Vcc + n \times Vth$$

wherein $V_{TS}$ represents a signal voltage applied to the test mode signal input terminal.

The source potential of transistor 1206 at the final stage of the series connected n channel MOS transistor can be used as signal SBT, for example, to use the test signal input terminal also as another signal input terminal.

As described above, semiconductor memory device 1000 according to the first embodiment need only externally receive external power supply potential ext.Vcc, ground voltage GND and test mode designation signal TS to conduct burn-in testing for writing a checker pattern into a memory cell array.

Thus, in conducting burn-in testing, it is not necessary for the tester side to generate an address signal and written data taking into consideration scrambling using software.

That is, fast and easy burn-in testing of semiconductor memory device 1000 can be achieved.

Furthermore, since externally applied signals need only be the three mentioned above, only three probe needles are required for each chip, for example, in the form of wafer and thus burn-in testing of semiconductor memory devices in the form of a wafer can be also carried out.

Second Embodiment

Figure 21:
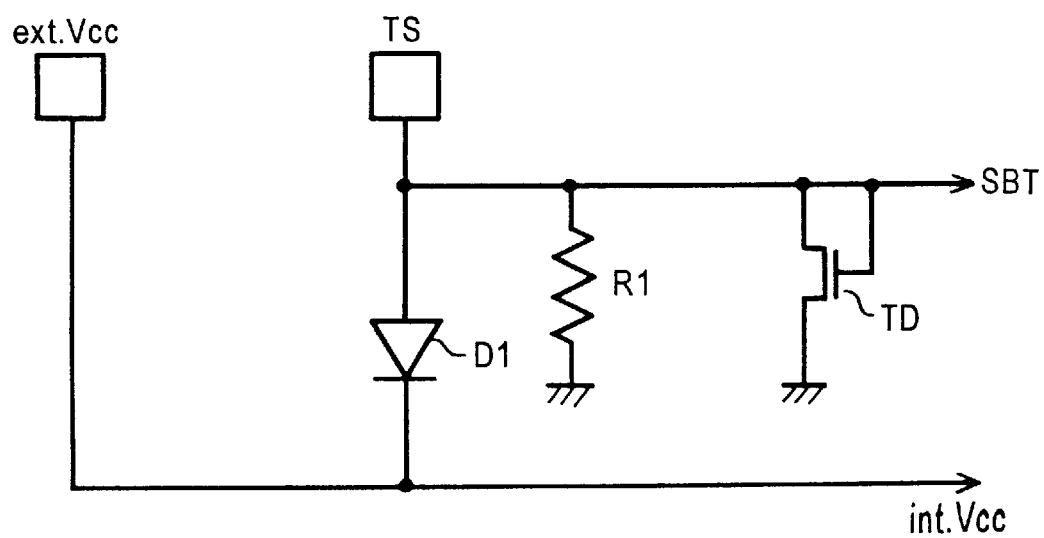
FIG. 21 is a circuit diagram showing a configuration of a test mode setting circuit 121 according to a second embodiment of the present invention.

FIG. 21 is a circuit diagram showing a configuration of test mode setting circuit 121 according to a second embodiment of the present invention.

It differs from the configuration of semiconductor memory device 1000 according to the first embodiment in that a power supply potential can also be supplied to an internal circuit via a test mode signal input terminal rather than an external power supply potential input terminal.

Test mode setting circuit 121 includes a high resistance element R1 connected between a test mode signal input terminal and a ground potential GND, a diode-connected transistor TD provided between the test mode input terminal and a ground potential, and a diode D1 connected between the test mode signal input terminal and a power source supplying line.

When the test mode signal input terminal receives a potential equal to or more than external power supply potential ext.Vcc, signal SBT attains an active H level and the power source supplying line for supplying an power supply potential to an internal circuit of semiconductor memory device 1000 is supplied via the test mode signal input terminal with an internal power supply potential int.Vcc which is reduced from an potential input to the terminal by a threshold voltage for diode D1.

The rest of the configuration is similar to that of semiconductor memory device 1000 shown in FIG. 1.

In carrying out burn-in testing, such a configuration only requires that the two of a test mode signal input terminal and a ground potential supplying terminal externally receive predetermined potential.

Thus, the number of probe needles required per chip in burn-in testing can be further reduced.

Figure 22:
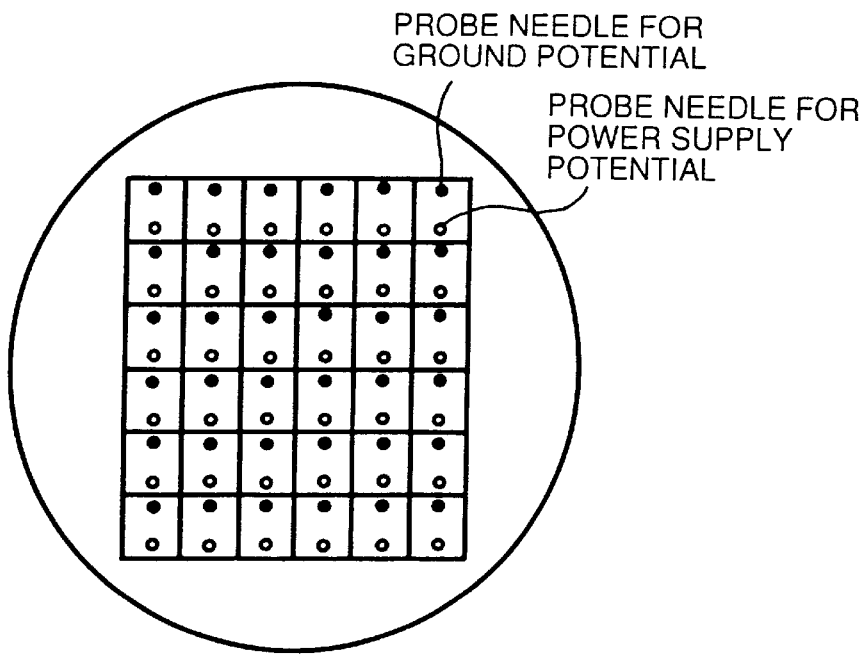
FIG. 22 is a planar view of a configuration of a probe card for a semiconductor memory device according to the second embodiment.
Figure 23:
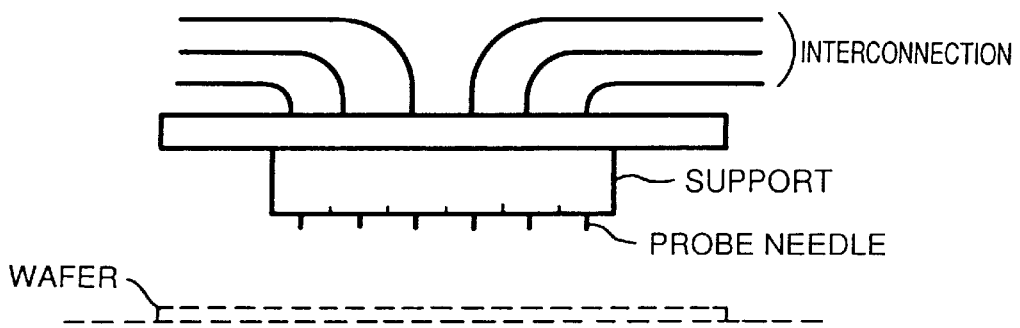
FIG. 23 is a side view of the probe card shown in FIG. 22.

FIG. 22 is a planar view of a probe card in the direction of a probe needle when two probe needles are used for each chip such as described above, and FIG. 23 is a side view of the probe card.

As shown in FIG. 22, the probe card has a probe needle (a black circle in the figure) for supplying a ground potential and a probe needle (a white circle in the figure) for supplying a power supply potential to a test mode signal input terminal for each chip such that they correspond to a chip location arranged on a wafer.

In order to apply a similar configuration to a conventional semiconductor memory device, a probe needle for supplying power source, a probe needle for supplying a ground potential, a probe needle for supplying a ground potential, a probe needle for supplying a test mode signal, a probe needle for supplying an address signal, a probe needle for supplying a control signal such as signal ext.RAS and the like are required and the number of probe needles required per chip will be significantly increased as compared with the present embodiment.

The configuration described above allows burn-in testing of semiconductor devices in the form of wafer and thus a number of chips can be tested in parallel so that testing time period and testing cost can be reduced.

Furthermore, burn-in testing of semiconductor devices in the form of wafer allows reduction of cost for molding defective chips.

Third Embodiment

Figure 24:
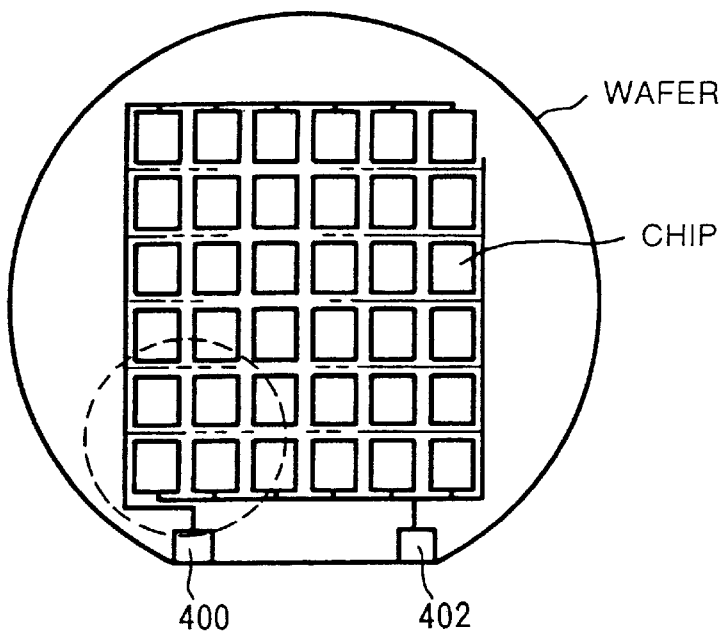
FIG. 24 is a planar view when a semiconductor memory device according to a third embodiment of the present invention is arranged on a wafer.

FIG. 24 is a planar view for illustrating a formation of a semiconductor memory device according to a third embodiment of the present invention on a wafer.

Referring to FIG. 24, each semiconductor memory device chip arranged in two dimension on a wafer is provided with an interconnection for supplying a power supply potential and a ground potential at a dicing portion as a margin region for chip separation processing by a dicer.

More specifically, when a semiconductor memory device according to the third embodiment is in the form of a wafer and has not yet been separated into a chip, it has a power source supplying pad 400 and a ground potential supplying pad 402 on a wafer surface at a facet portion or the like. The power supply potential supplying pad is provided with an interconnection for supplying a power supply potential to each chip via a dicing portion disposed between chips, and ground potential supplying pad 402 is similarly provided with an interconnection for supplying a ground potential to each chip at a dicing portion.

Figure 25:
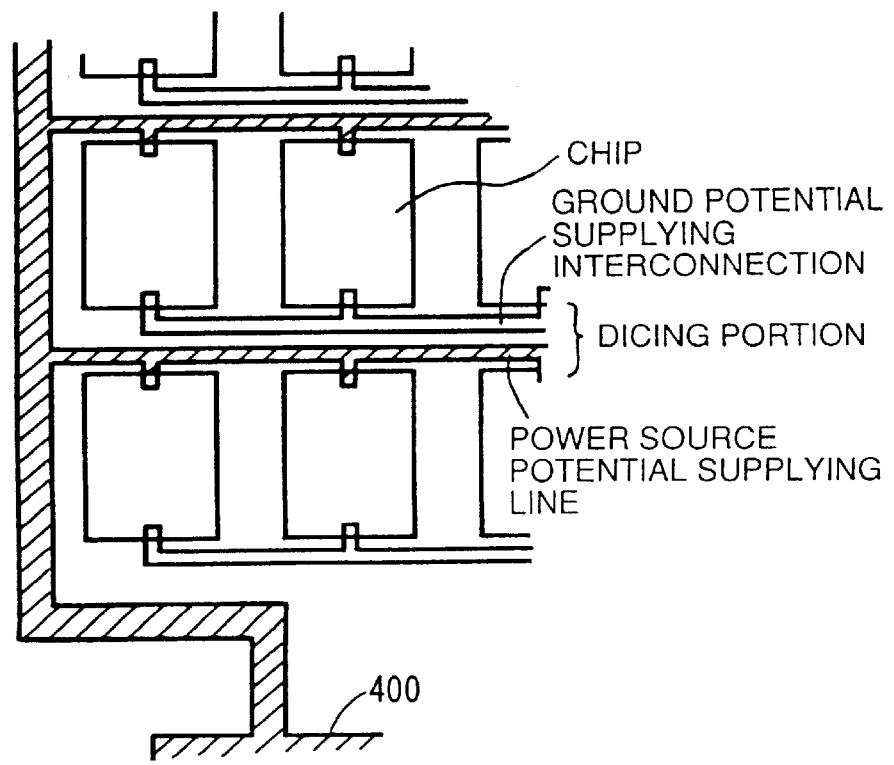
FIG. 25 is a partially enlarged view of FIG. 24.

FIG. 25 is a partially enlarged view of the view circled by the broken line in the planar view shown in FIG. 24.

A power supply potential supplying interconnection is provided for supplying a power supply potential from power supply potential supplying pad 400 via a dicing portion to each chip.

Meanwhile, a ground potential supplying interconnection is provided for supplying a ground potential from ground potential supplying pad 402 via a dicing portion to each chip.

Such a structure dispenses with supplying of a power supply potential or ground potential for each chip in burn-in testing of semiconductor devices in the form of a wafer.

For such an arrangement of semiconductor memory device 1000 according to the first embodiment on a wafer as shown in FIG. 24, burn-in testing of the semiconductor memory device in the form of a wafer can be carried out simply by arranging one probe needle for supplying a test mode designation signal for each chip on a probe card.

Meanwhile, for such an arrangement of the semiconductor memory device according to the second embodiment on a wafer as shown in FIG. 24, burn-in testing of the semiconductor memory device in the form of a wafer can be carried out simply by supplying an external power supply potential and a ground potential from power source supplying pad 400 and ground potential supplying pad 402, respectively.

Thus, it is not necessary in this example to supply a signal from a probe needle to a chip.

Such a configuration allows easy burn-in testing of each chip in the form of a wafer, and hence reduction of testing time period and testing cost can be achieved.

Figure 26:
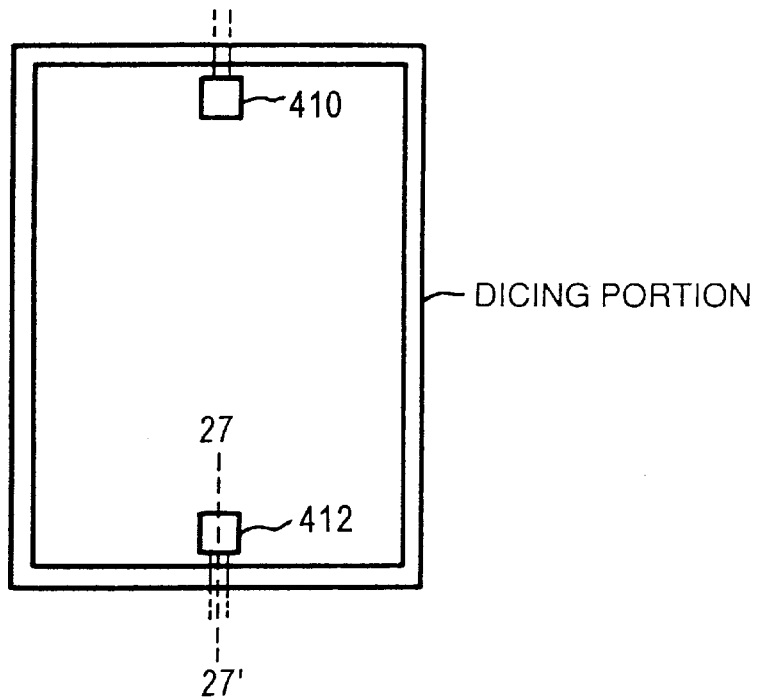
FIG. 26 is a planar view of a configuration of a semiconductor chip shown in FIG. 24 after separation.

FIG. 26 is a top view of a configuration of a semiconductor memory device chip after the chip arranged as shown in FIG. 25 in the form of a wafer is separated by a dicer.

At a perimeter of the chip is left a dicing portion (i.e., a processing margin region for chip separation process) which remains after chip separation process. Due to the structure as shown in FIG. 25, an interconnection from a power source supplying terminal or test mode designation signal input terminal 412 to a dicing portion still remains and another interconnection also remains on a surface from ground potential supplying terminal 410 to a dicing portion on a semiconductor memory device chip after chip separation.

Figure 27:
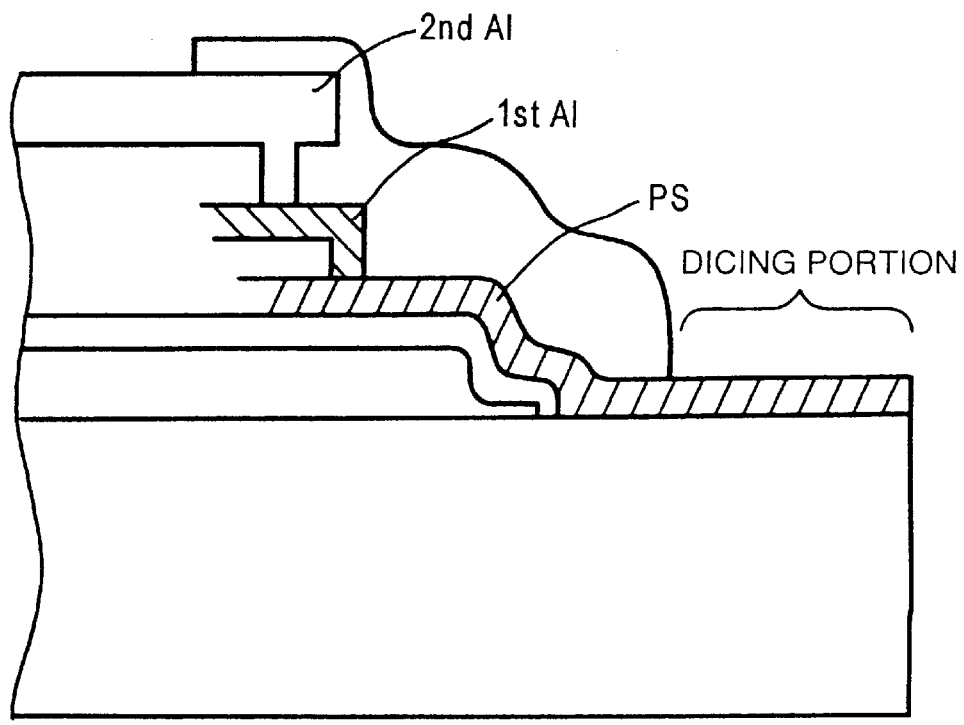
FIG. 27 is a cross section view taken along line AA' of FIG. 26.
Figure 28:
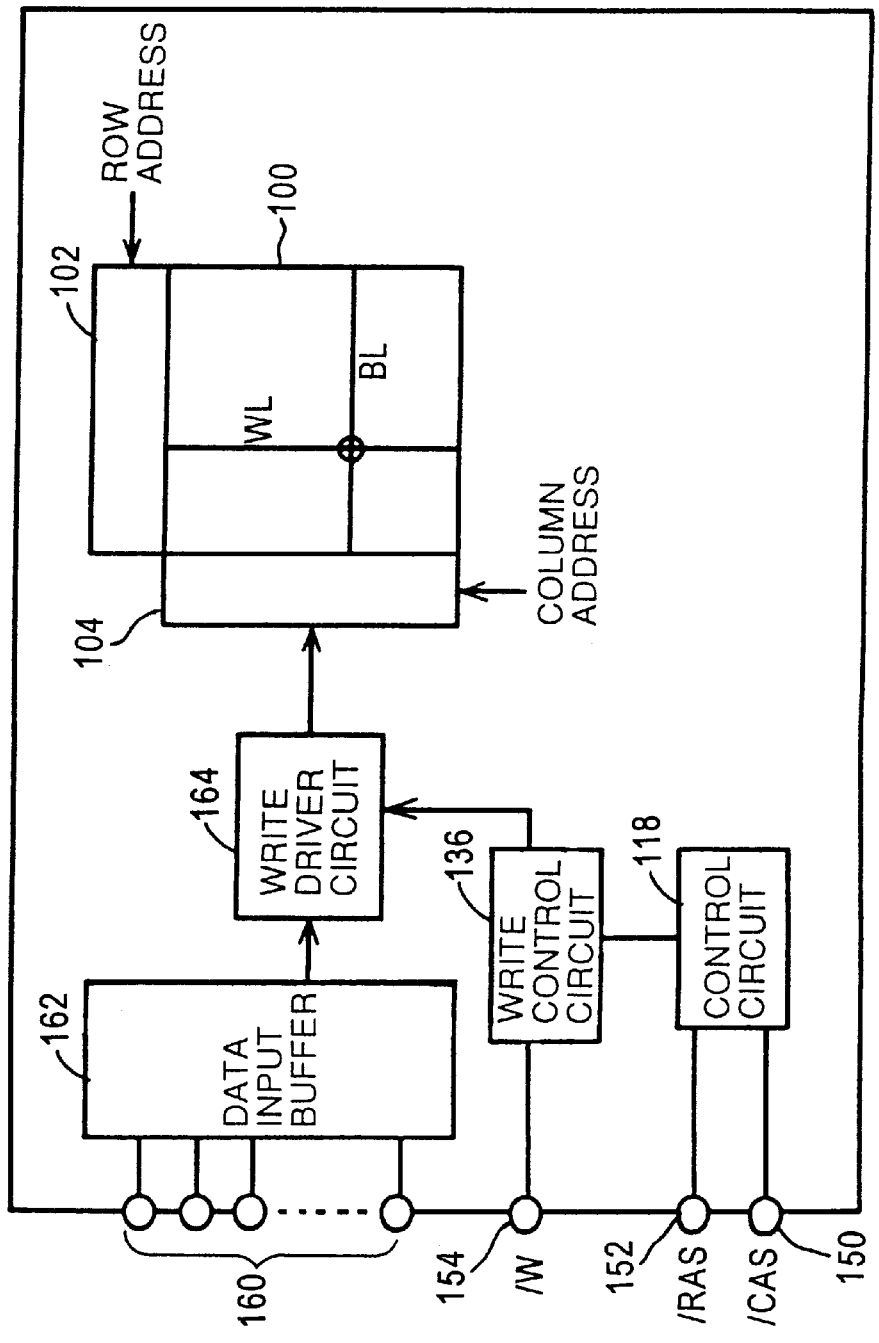
FIG. 28 is a schematic block diagram showing a configuration of a data write circuit of a conventional semiconductor memory device 2000.
Figure 29:
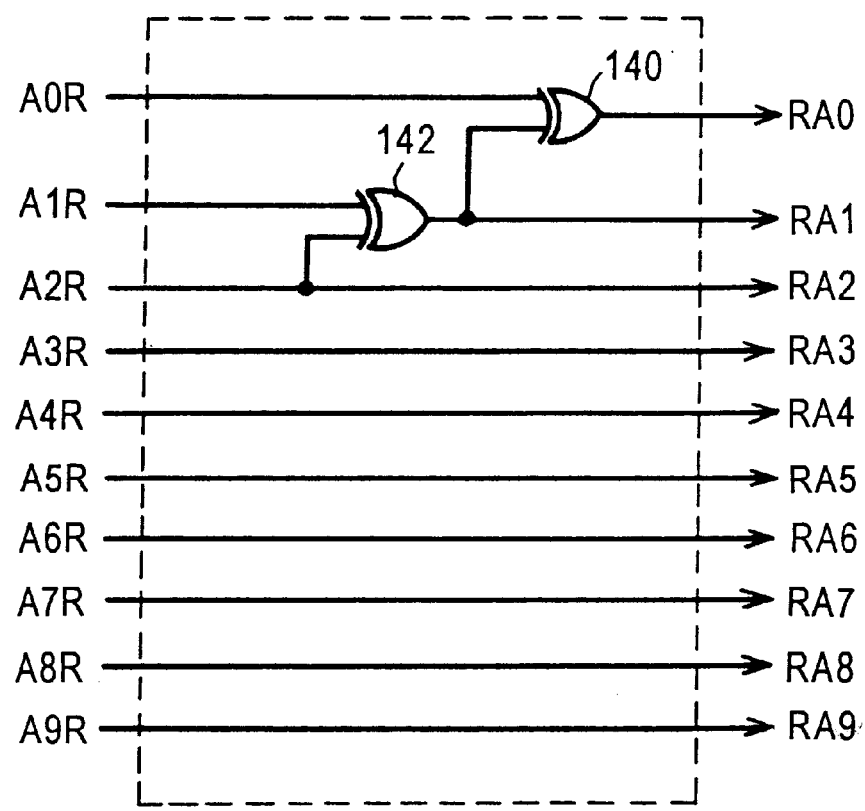
FIG. 29 is a conceptual diagram showing one example of address scrambling in a conventional semiconductor memory device.
Figure 30:
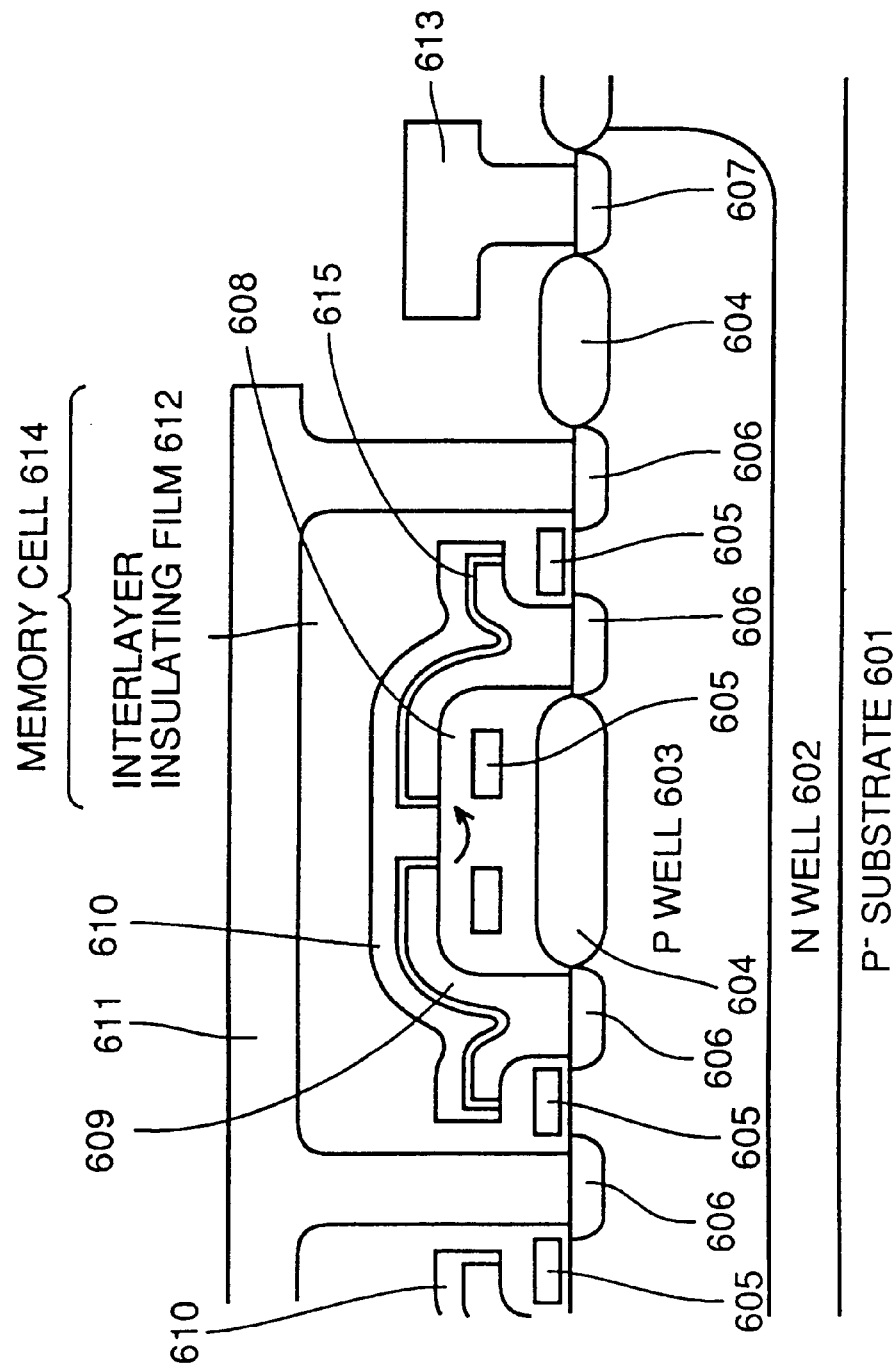
FIG. 30 is a cross sectional view showing a cross sectional structure of a memory cell portion of a conventional semiconductor memory device.
Figure 31:
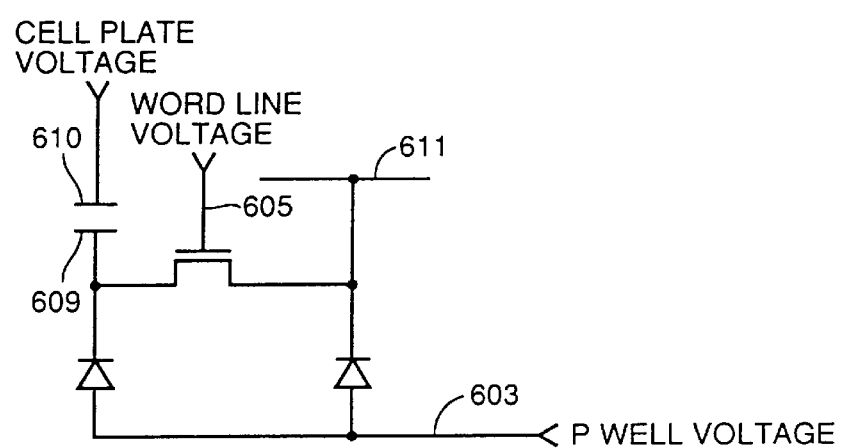
FIG. 31 is a circuit equivalent to the cross sectional view shown in FIG. 30.
Figure 33:
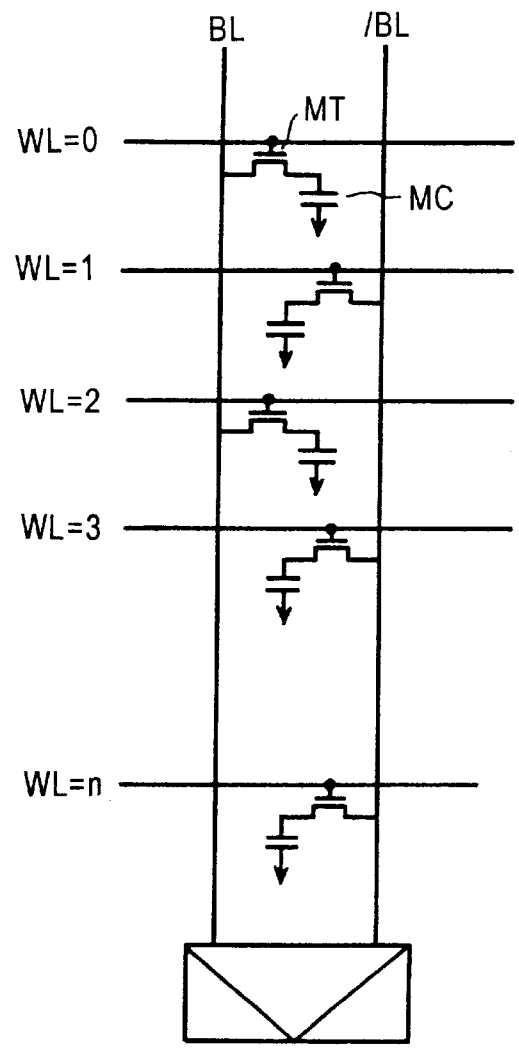
FIG. 33 is a schematic block diagram showing an arrangement of memory cells, word lines and a pair of bit lines.
Figure 34:
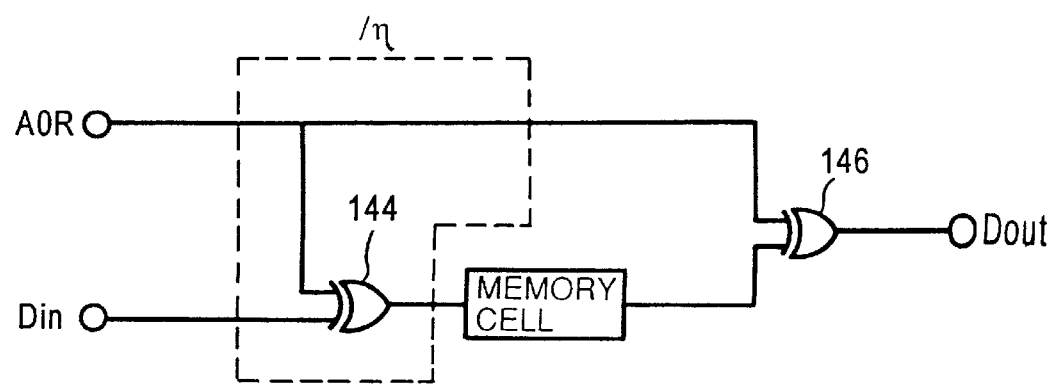
FIG. 34 is a conceptual diagram for illustrating data scrambling.

FIG. 27 is a cross sectional view taken along line AA' shown in FIG. 26.

In FIG. 27, a test mode designation signal input terminal or power supply voltage input terminal is formed of an aluminum interconnection at the second layer. Under the second layer aluminum interconnection exists an aluminum interconnection of the first layer with an insulating layer posed therebetween, and the both are connected to each other via a contact hole which is opened in an interlayer insulating film. Under the first layer aluminum interconnection still exists a polysilicon interconnection layer PS with an interlayer insulating film disposed therebetween. Polysilicon interconnection layer PS forms an interconnection reaching a dicing portion.

While such an interconnection reaching to a dicing portion may of course be formed of an aluminum interconnection, the use of such a polysilicon interconnection can ensure the moisture resistance of a chip when burn-in testing or the like is carried out.

Thus, for such a semiconductor chip as shown in FIG. 27 arranged as shown in FIG. 25, an interconnection leading to power source supplying pad 400 can be formed of the polysilicon interconnection layer.

If some problem is caused depending on the resistance value of the polysilicon interconnection portion, power supply potential supplying pad 400 and ground potential supplying pad 402 can be arranged, for example, at a plurality of portions of a wafer to reduce the effective distance from each pad to each semiconductor memory device chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of pairs of bit lines;
   a plurality of word lines intersecting said plurality of pairs of bit lines;
   a memory cell array having a plurality of memory cells arranged at intersections of said pairs of bit lines and said word lines in a matrix and each holding one of binary data;
   operating mode setting means responsive to an externally applied indication for activating a first operating mode signal;
   internal address generation means responsive to activation of said first operating mode signal for outputting internal address signals sequentially selecting said memory cells such that the order of said internal address signals corresponds to that of physical addresses of said memory cells;
   memory cell selecting means responsive to each of said internal address signals during the active state of said first operating mode signal for selecting a corresponding memory cell to write data; and
   internal data generation means for outputting internal data to said memory cell selecting means to write said binary data in a checker pattern into memory cells sequentially selected by said internal address signals depending on an arrangement of said plurality of pairs of bit lines, a plurality of word lines and of a plurality of memory cells.

2. The semiconductor memory device according to claim 1, wherein:

said internal address signals include internal row address signals and internal column address signals, said internal address generation means includes internal row address generation means responsive to activation of said first operating mode signal for outputting said internal row address signals sequentially selecting rows of said memory cell array such that the order of said internal row address signals corresponds to that of said physical addresses, and internal column address generation means for outputting internal column address signals in such a way that sequentially selected internal column addresses are updated every cycle of row selection by said internal row address generation means; and said memory cell selecting means includes row selecting means responsive to each of said internal row address signals for selecting a corresponding word line, and column selecting means responsive to each of said internal column address signals for selecting a corresponding pair of bit lines to write data.

3. The semiconductor memory device according to claim 2, further comprising a plurality of sense amplifying means responsive to stored information of a selected memory cell for complimentarily driving potentials of corresponding paired bit lines, wherein;

said internal row address generation means includes internal clock generation means, and row address counting means responsive to an output of said internal clock generation means for cyclically outputting an internal row address signal;

said operating mode setting means activates one of said first operating mode signal and a second operating mode signal in response to an externally applied indication;

in response to activation of said first operating mode signal, an output of said internal data generation circuit is written into a memory cell selected by said row selecting means and said column selecting means; and in response to activation of said second operating mode signal, said column selecting means is inactivated, said row selecting means selects a corresponding word line in response to said internal row address signal, and said sense amplifying means rewrites the stored information into a plurality of memory cells connected to a selected said word line.

4. The semiconductor memory device according to claim 3, wherein said internal clock generation means further includes a frequency dividing means for rendering shorter a period of an internal clock signal output when said first operating mode signal is activated than when said second operating mode signal is activated.

5. The semiconductor memory device according to claim 1, further comprising a test terminal receiving said externally applied indication as a voltage signal, and power supply potential supplying means for supplying a potential applied to said test terminal to said semiconductor memory device as a power supply voltage, wherein said operating mode setting means activates said first operating mode signal in response to the potential applied to said test terminal.

6. The semiconductor memory device according to claim 5, said semiconductor memory device being separated as a chip from a semiconductor substrate on which said semiconductor memory devices are formed, further comprising:

a processing margin region at a most peripheral portion of a surface of said chip for separation process;

a plurality of power supply terminals arranged at an internal region of a chip surface surrounded by said processing margin region, and externally receiving a power supply potential; and an interconnection extending from each of said power supply terminals to said processing margin region; wherein said plurality of power supply terminals include said test terminal.

7. The semiconductor memory device according to claim 6, wherein said interconnection is a polysilicon interconnection.

8. The semiconductor memory device according to claim 1, said semiconductor memory device being separated as a chip from a semiconductor substrate on which said semiconductor memory devices are formed, further comprising:

a processing margin region at a most peripheral portion of a surface of said chip for separation process;

a plurality of power supply terminals arranged at an internal region of a chip surface surrounded by said processing margin region, and externally receiving a power supply potential; and an interconnection extending from each of said power supply terminals to said processing margin region.

9. The semiconductor memory device according to claim 8, wherein said interconnection is a polysilicon interconnection.

10. The semiconductor memory device according to claim 1, further comprising:

switching means for selectively outputting to said memory cell selecting means one out of external address signals and said internal signals according to said first operating mode signal; and wherein said memory cell selecting means selects said memory cells having said physical addresses corresponding to rearrangement of said external address signals during the inactivation state of said first operating mode signal, while said memory cell selecting means selects said memory cells in order of said physical address of said memory cell array during activation state of said first operating mode signal.

11. A semiconductor memory device separated as a chip from a semiconductor substrate on which said semiconductor memory devices are formed, comprising:

a processing margin region at a most peripheral portion of a surface of said chip for separation process;

a power supply terminal arranged at an internal region of a chip surface surrounded by said processing margin region, and externally receiving a power supply potential; and an interconnection extending from said power supply terminal to said processing margin region.

12. A semiconductor memory device comprising a plurality of pairs of bit lines;

a plurality of word lines intersecting said plurality of pairs of bit lines;

a memory cell array having a plurality of memory cells arranged at intersections of said pairs of bit lines and said word lines in a matrix and each holding one of binary data;

operating mode setting means responsive to an externally applied indication for activating a first operating mode signal;

internal address generation means responsive to activation of said first operating mode signal for outputting internal address signals sequentially selecting said memory cells such that the order of said internal address signal corresponds to that of physical addresses of said memory cells;

memory cell selecting means, responsive to each of said internal address signals during the active state of first operating mode signal for selecting a corresponding memory cell to write data; and internal data generating means for outputting internal data to said memory cell selecting means to write said binary data in a prescribed pattern into memory cells sequentially selected by said internal address signals depending on an arrangement of said plurality of pairs of bit lines, a plurality of word lines and of a plurality of memory cells.

13. The semiconductor memory device according to claim 12, further comprising:

control means for controlling operations of said semiconductor memory device, said control means including a first internal signal generation circuit, in response to activation of said first operating mode signal, for generating internal row address strobe signals, and a second internal signal generation circuit, in response to activation of said first operating mode signal, for generating internal column address strobe signals.

14. A semiconductor device comprising:

a semiconductor substrate;

a plurality of semiconductor memory circuits formed on the main surface of said semiconductor substrate and each separable as a chip from said semiconductor substrate;

processing margin regions each provided on the main surface of said semiconductor substrate and outside a most peripheral portion of said semiconductor memory circuit for chip separation process;

a power supply pad provided on said semiconductor substrate for externally receiving a power supply potential;

a plurality of power supply terminals each arranged at an internal region of one of chip surfaces surrounded by said processing margin region; and an interconnection extending on said processing margin regions for transmitting said power supply potential from said power supply pad to said power supply terminals.

15. The semiconductor device according to claim 14, wherein said interconnection is a polysilicon interconnection.

* * * * *